United States Patent [19]

Nishi

[11] Patent Number: 5,798,195
[45] Date of Patent: Aug. 25, 1998

[54] STEPPING ACCURACY MEASURING METHOD

[75] Inventor: Kenji Nishi, Kanagawa-ken, Japan

[73] Assignee: Nikon Corporation, Tokyo, Japan

[21] Appl. No.: 966,844

[22] Filed: Nov. 7, 1997

Related U.S. Application Data

[63] Continuation of Ser. No. 311,057, Sep. 23, 1994, abandoned.

[30] Foreign Application Priority Data

Sep. 24, 1993 [JP] Japan .................. 5-237770
Apr. 22, 1994 [JP] Japan .................. 6-084477

[51] Int. Cl.$^6$ .................................................. G03F 7/22
[52] U.S. Cl. .............................. 430/22; 430/30; 430/394
[58] Field of Search ............................ 430/30, 22, 394

[56] References Cited

U.S. PATENT DOCUMENTS

| | | | |
|---|---|---|---|
| 5,362,585 | 11/1994 | Adams | 430/30 |
| 5,468,580 | 11/1995 | Tanaka | 430/22 |
| 5,543,256 | 8/1996 | Shinoda et al. | 430/22 |

FOREIGN PATENT DOCUMENTS

| | | | |
|---|---|---|---|
| 0455446 | 11/1991 | European Pat. Off. | 430/30 |
| 0534758 | 3/1993 | European Pat. Off. | 430/30 |
| 4208103 | 9/1993 | Germany | 430/30 |
| 58-176934 | 10/1983 | Japan | 430/22 |

Primary Examiner—Bernard P. Codd
Attorney, Agent, or Firm—Armstrong, Westerman, Hattori, McLeland & Naughton

[57] ABSTRACT

In a stepping accuracy measuring method according to the present invention, LIA measuring marks are successively exposed to shot areas on a wafer as reticle pattern images. In a first measurement, positions of the LIA measuring marks on respective shot areas are detected in a predetermined sequence, thereby monitoring coordinate values of a wafer stage on which the wafer is rested by means of a laser interferometer. Thereafter, in a second measurement, the positions of the LIA measuring marks on the shot areas are detected in a sequence different from the above-mentioned predetermined sequence, for instance, thereby monitoring coordinate values of the wafer stage by means of the laser interferometer. A stepping error is determined on the basis of a difference between the results obtained in the first measurement and the results obtained in the second measurement. In a stage accuracy evaluation method according to the present invention, an alignment error between adjacent shot areas is measured by a vernier evaluation method. By separating a linear error component comprised of scaling values, degree of perpendicularity, rotation and offset from such an alignment error, a non-linear error component is determined. An error component caused by yawing of the wafer stage and an error component caused by distortion of movable mirrors of the laser interferometer are extracted.

5 Claims, 32 Drawing Sheets

$\Delta X (3\sigma) = 20$ [nm]

$\Delta Y (3\sigma) = 23$ [nm]

(a)

(b) ALIGNMENT ERROR

|  | SX | BY |
|---|---|---|
| NUMBER OF MEASUREMENTS | 52 | 52 |
| AVERAGE VALUE ($\mu$m) | 0.000 | 0.005 |
| $3\sigma$ ($\mu$m) | 0.000 | 0.137 |
| Rx, Ry (ppm) | 0.00 | 0.50 |
| $\omega$, $\theta$ ($\mu$rad) | −1.00 | 1.00 |

(c) LINEAR ERROR

|  | X | Y |
|---|---|---|
| $3\sigma$ ($\mu$m) | 0.000 | 0.137 |

(d) NON-LINEAR ERROR

|  | X | Y |
|---|---|---|
| $3\sigma$ ($\mu$m) | 0.000 | 0.000 |

(a)

(b) ALIGNMENT ERROR

|  | BX | SY |
|---|---|---|
| NUMBER OF MEASUREMENTS | 52 | 52 |
| AVERAGE VALUE ($\mu$m) | 0.010 | 0.000 |
| $3\sigma$ ($\mu$m) | 0.137 | 0.000 |
| Rx, Ry (ppm) | $-1.00$ | 0.00 |
| $\omega$, $\theta$ ($\mu$rad) | 0.50 | 0.00 |

(c) LINEAR ERROR

|  | X | Y |
|---|---|---|
| $3\sigma$ ($\mu$m) | 0.137 | 0.000 |

(d) NON-LINEAR ERROR

|  | X | Y |
|---|---|---|
| $3\sigma$ ($\mu$m) | 0.000 | 0.000 |

(a)

(b) ALIGNMENT ERROR

|  | SX | BY |
|---|---|---|
| NUMBER OF MEASUREMENTS | 52 | 52 |
| AVERAGE VALUE ($\mu$m) | 0.000 | 0.002 |
| $3\sigma$ ($\mu$m) | 0.000 | 0.045 |
| Rx, Ry (ppm) | 0.00 | 0.00 |
| $\omega, \theta$ ($\mu$rad) | −0.33 | 0.33 |

(c) LINEAR ERROR

|  | X | Y |
|---|---|---|
| $3\sigma$ ($\mu$m) | 0.000 | 0.041 |

(d) NON-LINEAR ERROR

|  | X | Y |
|---|---|---|
| $3\sigma$ ($\mu$m) | 0.000 | 0.019 |

(a)

(b) ALIGNMENT ERROR

|  | BX | SY |
|---|---|---|
| NUMBER OF MEASUREMENTS | 52 | 52 |
| AVERAGE VALUE ($\mu$m) | −0.005 | 0.000 |
| $3\sigma$ ($\mu$m) | 0.091 | 0.000 |
| Rx, Ry (ppm) | −0.00 | 0.00 |
| $\omega, \theta$ ($\mu$rad) | −0.67 | 0.00 |

(c) LINEAR ERROR

|  | X | Y |
|---|---|---|
| $3\sigma$ ($\mu$m) | 0.082 | 0.000 |

(d) NON-LINEAR ERROR

|  | X | Y |
|---|---|---|
| $3\sigma$ ($\mu$m) | 0.039 | 0.000 |

(a)

(b) ALIGNMENT ERROR

|  | SX | BY |
|---|---|---|
| NUMBER OF MEASUREMENTS | 52 | 52 |
| AVERAGE VALUE ($\mu$m) | 0.064 | 0.076 |
| 3$\sigma$ ($\mu$m) | 0.029 | 0.059 |
| Rx, Ry (ppm) | 0.02 | −0.42 |
| $\omega$, $\theta$ ($\mu$rad) | 0.00 | 0.02 |

(c) LINEAR ERROR

|  | X | Y |
|---|---|---|
| 3$\sigma$ ($\mu$m) | 0.005 | 0.052 |

(d) NON-LINEAR ERROR

|  | X | Y |
|---|---|---|
| 3$\sigma$ ($\mu$m) | 0.028 | 0.027 |

(a)

(b) ALIGNMENT ERROR

|  | BX | SY |
|---|---|---|
| NUMBER OF MEASUREMENTS | 52 | 52 |
| AVERAGE VALUE ($\mu$m) | −0.187 | 0.066 |
| $3\sigma$ ($\mu$m) | 0.047 | 0.029 |
| Rx, Ry (ppm) | −0.03 | −0.08 |
| $\omega$, $\theta$ ($\mu$rad) | −0.22 | 0.00 |

(c) LINEAR ERROR

|  | X | Y |
|---|---|---|
| $3\sigma$ ($\mu$m) | 0.027 | 0.010 |

(d) NON-LINEAR ERROR

|  | X | Y |
|---|---|---|
| $3\sigma$ ($\mu$m) | 0.038 | 0.026 |

(a)

(b) ALIGNMENT ERROR

|  | SX | BY |
|---|---|---|
| NUMBER OF MEASUREMENTS | 52 | 52 |
| AVERAGE VALUE ($\mu$m) | −0.000 | 0.000 |
| 3$\sigma$ ($\mu$m) | 0.029 | 0.027 |
| Rx, Ry (ppm) | 0.02 | 0.00 |
| $\omega$, $\theta$ ($\mu$rad) | 0.02 | −0.00 |

(c) LINEAR ERROR

|  | X | Y |
|---|---|---|
| 3$\sigma$ ($\mu$m) | 0.005 | 0.003 |

(d) NON-LINEAR ERROR

|  | X | Y |
|---|---|---|
| 3$\sigma$ ($\mu$m) | 0.028 | 0.027 |

(a)

(b) ALIGNMENT ERROR

|  | BX | SY |
|---|---|---|
| NUMBER OF MEASUREMENTS | 52 | 52 |
| AVERAGE VALUE ($\mu$m) | 0.000 | −0.000 |
| 3$\sigma$ ($\mu$m) | 0.028 | 0.029 |
| Rx, Ry (ppm) | 0.00 | −0.08 |
| $\omega$, $\theta$ ($\mu$rad) | 0.05 | 0.00 |

(c) LINEAR ERROR

|  | X | Y |
|---|---|---|
| 3$\sigma$ ($\mu$m) | 0.009 | 0.010 |

(d) NON-LINEAR ERROR

|  | X | Y |
|---|---|---|
| 3$\sigma$ ($\mu$m) | 0.026 | 0.026 |

FIG. 32A
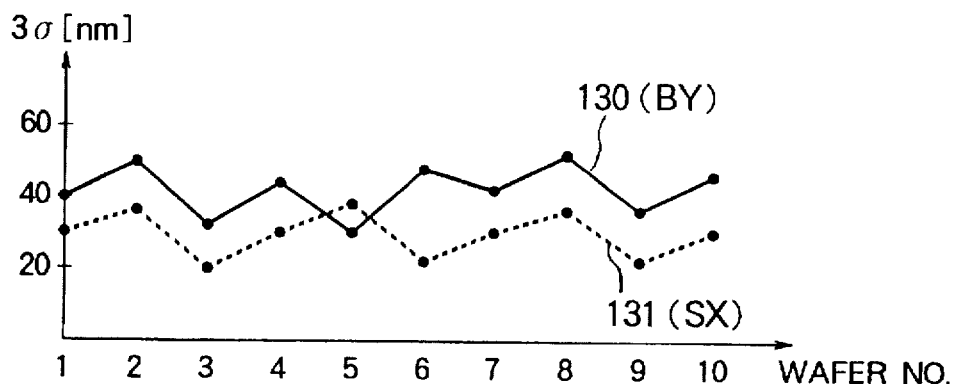
FIG. 32B
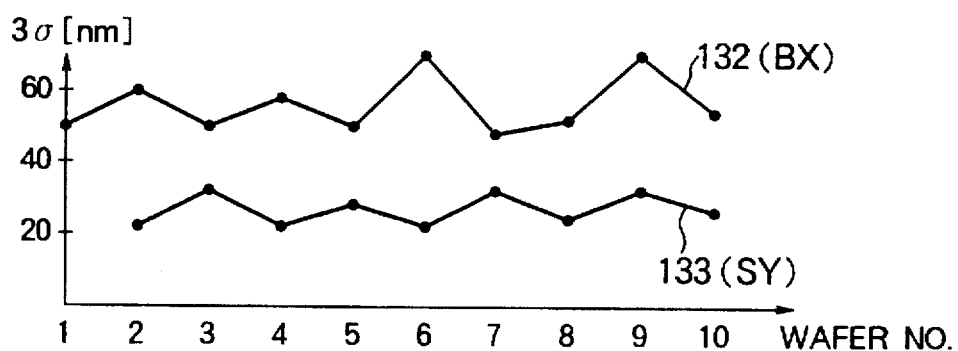
FIG. 32C
|  | SX | BY | BX | SY |
|---|---|---|---|---|
| AVERAGE VALUE OF 3σ PER WAFER AVw [nm] | 30 | 44 | 48 | 28 |
| DISPERSION OF ALL WAFERS VRw [nm] | 33 | 50 | 53 | 32 |
| DISPERSION IN CORRESPONDING SHOT AREAS VRs [nm] | 20 | 28 | 30 | 21 |
REPRODUCIBILITY = 10nm (a)

(b)

(c)

STEPPING ACCURACY MEASURING METHOD

This application is a Continuation of application Ser. No. 08/311,057 filed Sep. 23, 1994, now abandoned.

BACKGROUND OF THE INVENTION

1. Field of the Invention

The present invention relates to a stepping accuracy measuring method suitable for measuring stepping accuracy of a substrate stage of a projection exposure apparatus for successively exposing a pattern image of a reticle onto each of shot areas on a substrate by a step-and-repeat process or a step-and-scan process when a semiconductor element, a liquid crystal display element or a thin-film magnetic head is manufactured by means of a photo-lithography process.

2. Related Background Art

In manufacturing semiconductor elements, liquid crystal display elements or the like by means of a photo-lithography process, there have been used projection exposure apparatuses wherein a pattern image of a photo-mask or a reticle (referred to generically as "reticle" hereinafter) is projected, by means of a projection optical system, onto each of shot areas on a wafer (or glass plate, or the like) on which photosensitive material is coated. With respect to projection exposure apparatuses of this kind, recently, there has widely been used a projection exposure apparatus of a so-called step-and-repeat type, particularly, a reducing exposure apparatus (or a so-called stepper), wherein a wafer is rested on a wafer stage which can be shifted two-dimensionally, and the wafer is repeatedly shifted step by step by means of the wafer stage to successively expose a pattern image of a reticle onto each of shot areas on the wafer.

In general, since a plurality of circuit patterns are laminated on a wafer to form a semiconductor element, in the projection exposure apparatuses, an alignment system has been used to accomplish accurate alignment or matching accuracy in aligning a pattern image of a currently used reticle with circuit patterns already formed on the wafer. Main factors influencing the alignment accuracy are positioning accuracy of a wafer stage for positioning each of shot areas of the wafer in an exposure position, position detecting accuracy for detecting positions of alignment marks in the alignment system, and environmental conditions (such as a room temperature). Hereinbelow, the positioning accuracy of the wafer stage, the position detecting accuracy in the alignment system and the like are generically regarded as stepping accuracy of a wafer stage.

Although various methods for measuring the stepping accuracy are already known, all of the conventional methods have low through-put, and, thus, improvement in such methods has been desired. Further, in the conventional methods, such as the method disclosed in U.S. Pat. No. 4,803,524, since correspondence between the measured result and factors lowering the stepping accuracy is not clear, even if it is found that the stepping accuracy is low, it cannot be determined which portion should be adjusted, and, therefore, adjustment can be done only by repeating trial and error. That is to say, even when the conventional method for measuring the stepping accuracy is used to adjust the wafer stage, a drive portion and other mechanisms of the wafer stage can not be adjusted in a proper sequence.

SUMMARY OF THE INVENTION

Accordingly, an object of the present invention is to provide a method for measuring stepping accuracy, which can eliminate the above-mentioned conventional drawbacks.

Another object of the present invention is to improve a so-called vernier evaluation method which is one method for evaluating results obtained from the measurement of stepping accuracy.

In the above-mentioned vernier evaluation method, a reticle on which a predetermined number of measuring marks are formed is used, and such a plurality of measuring marks are firstly exposed onto a first shot area on a wafer. Thereafter, a wafer stage is shifted step by step, for instance, in an X direction, so that the plurality of measuring marks are then exposed onto a second shot area where an end in the X direction is overlapped with the first shot area. In this case, at the overlapped zone, the initially exposed measuring marks (main scale) are positioned in the proximity of the secondly exposed measuring marks (sub scale). When there is no stepping error, a positional relation between the main scale and the sub scale is known, therefore, the stepping error can be determined by measuring the positional deviation or divergence of the relation between the main scale and the sub scale from that designed. This is a principle of the vernier evaluation method.

Further, in the vernier evaluation method, the measuring marks are exposed onto respective shot areas arranged in a grid pattern so that they are partially overlapped with each other in X and Y directions on the wafer, and, after development, amounts of positional divergence of the relation between the main and sub scales from the designed reference positional relation is measured, for example, regarding several tens of points on the wafer. Then, a standard deviation $\sigma$ (or $3\sigma$) of the positional divergence amounts is calculated, and, it is determined whether the stepping accuracy of the exposure apparatus can be accepted or not by judging whether the standard deviation $\sigma$ satisfies a predetermined requirement.

Also in this vernier evaluation method, since it is determined whether the stepping accuracy of the exposure apparatus can be accepted or not on the basis of the standard deviation $\sigma$ of the positional divergence amounts of the main and sub scales, even if the standard deviation $\sigma$ does not satisfy the predetermined requirement to indicate disqualification of the stepping accuracy, a concrete method for correcting the stepping accuracy cannot be determined. Thus, in the past, if the stepping accuracy was disqualified (i.e., not accepted), the stepping accuracy was corrected only by repeating trial and error (for example, by accurately rearranging the stage drive system or by exchanging the stage drive system for a new one), and, thus, eventually, a time required for correcting the stepping accuracy was increased and through-put for assembling and adjusting the stage mechanism could not be improved.

The present invention provides an improved method for measuring stepping accuracy of a substrate stage in an exposure apparatus comprising the substrate stage for holding a photosensitive substrate on which a pattern on a mask is exposed and for positioning the substrate in a two-dimensional plane, a coordinate value measuring device for measuring coordinate values of the substrate stage, and an alignment system for detecting positioning marks on the substrate.

This method comprises a first step for resting a predetermined substrate having a plurality of measuring patterns previously formed on the substrate stage, detecting and storing positions of the plurality of measuring patterns in a first predetermined sequence by means of the alignment system, and storing values of the coordinates of the substrate stage measured by the coordinate value measuring device when the positions of the measuring patterns are detected by the alignment system; a second step for detecting and storing the positions of the measuring patterns on the predetermined substrate in a second predetermined sequence by means of the alignment system, and storing values of the coordinate of the substrate stage measured by the coordinate measuring device when the positions of the measuring patterns are detected by the alignment system; and a third step for comparing measured results obtained in the first step with corresponding measured results obtained in the second step for each of the measuring patterns on the predetermined substrate.

Another stepping accuracy measuring method according to the present invention comprises a first step for resting a substrate on which a first plurality of measuring patterns have been formed by using a predetermined mask on the substrate stage, exposing a pattern of the same mask onto the substrate in a corresponding relationship to the first plurality of measuring patterns in a predetermined sequence, detecting and storing positions of the measuring patterns by means of the alignment system when the pattern of the mask is exposed, and storing values of the coordinates of the substrate stage measured by the coordinate value measuring device when the positions of the first plurality of measuring patterns are detected by the alignment system; a second step for detecting and storing positions of a second plurality of measuring patterns formed by the exposed patterns of the mask exposed on the substrate in the first step by means of the alignment system, and storing values of the coordinates of the substrate stage measured by the coordinate value measuring device when the positions of the second plurality of measuring patterns are detected by the alignment system; and a third step for determining stepping accuracy of the substrate stage on the basis of the measured results obtained in the first step and the measured results obtained in the second step.

The present invention further provides an improved evaluation method for evaluating a stage in an apparatus having the stage for positioning a photosensitive substrate in first and second directions perpendicular to each other in a two-dimensional plane and adapted to expose a pattern of a mask onto the substrate.

This method comprises a first step for resting a photosensitive evaluation substrate on the stage, exposing a plurality of evaluation marks of the mask having such evaluation marks onto a first shot area on the evaluation substrate, driving the stage to shift the evaluation substrate, exposing the evaluation marks of the same mask onto a second shot area partially overlapped with the first shot area so that at least one of the marks on the first shot area and at least one of the marks on the second shot area are included in an overlapped zone, and repeating the above-mentioned operations; a second step for measuring deviation amounts of the exposed evaluation marks in the first and second directions for each of the overlapped zones between two adjacent shot areas on the evaluation substrate; a third step for determining a scaling error component included in linear error on the basis of the deviation amount obtained in the second step; and a fourth step for determining a rotational component of the stage when the latter is shifted on the basis of the scaling error component determined in the third step.

Another stage evaluation method according to the present invention comprises a first step for successively resting a plurality (N; integral number more than one) of photosensitive evaluation substrates on a stage one by one, and for each of the substrates, exposing a plurality of evaluation marks of the mask having such evaluation marks onto a first shot area on the substrate, driving the stage to shift the evaluation substrate, exposing the evaluation marks of the same mask onto a second shot area partially overlapped with the first shot area so that at least one of the marks on the first shot area and at least one of the marks on the second shot area are included in an overlapped zone, and repeating the above-mentioned operations; a second step for measuring, in each of said substrates, deviation amounts of the exposed evaluation marks in the first and second directions for each of the overlapped zones between two adjacent shot areas; and a third step for determining (a) average dispersion value obtained by determining a dispersion value of the deviation amounts for each substrate and averaging the dispersion values for the N evaluation substrates, (b) entire dispersion of the deviation amounts of the N evaluation substrates, and (c) dispersion among the N values each of which represents the deviation amounts in corresponding shot areas of the evaluation substrates, on the basis of the deviation amounts measured in the second step.

BRIEF DESCRIPTION OF THE DRAWINGS

FIGS. 32A and 32B are graphs showing another method for analyzing errors, according to the third embodiment of the present invention, and FIG. 32C is a table showing some factors in the errors;

DETAILED DESCRIPTION

Figure 34:
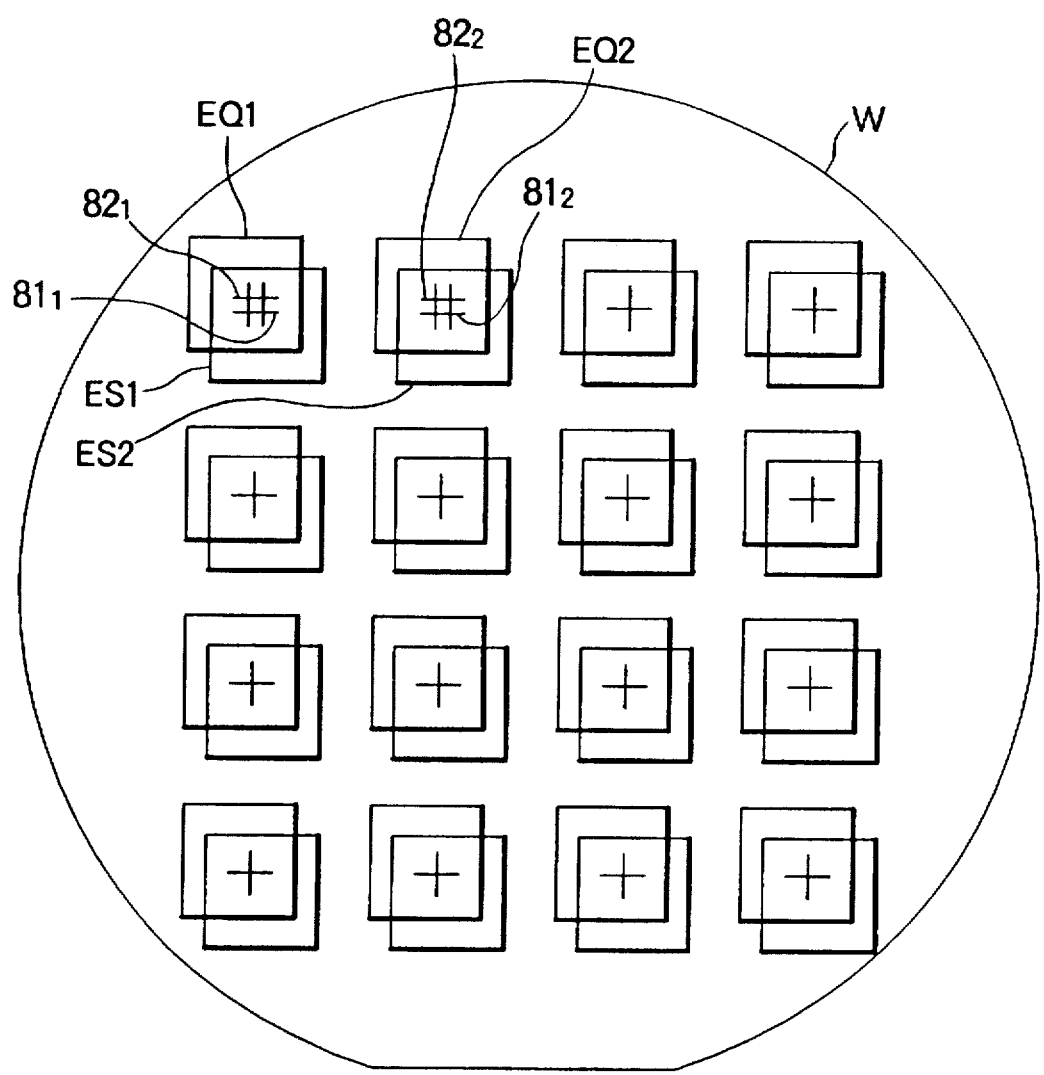
FIG. 34 is a plan view showing arrangement of shot areas in a conventional stepping accuracy measuring method.
Figure 35:
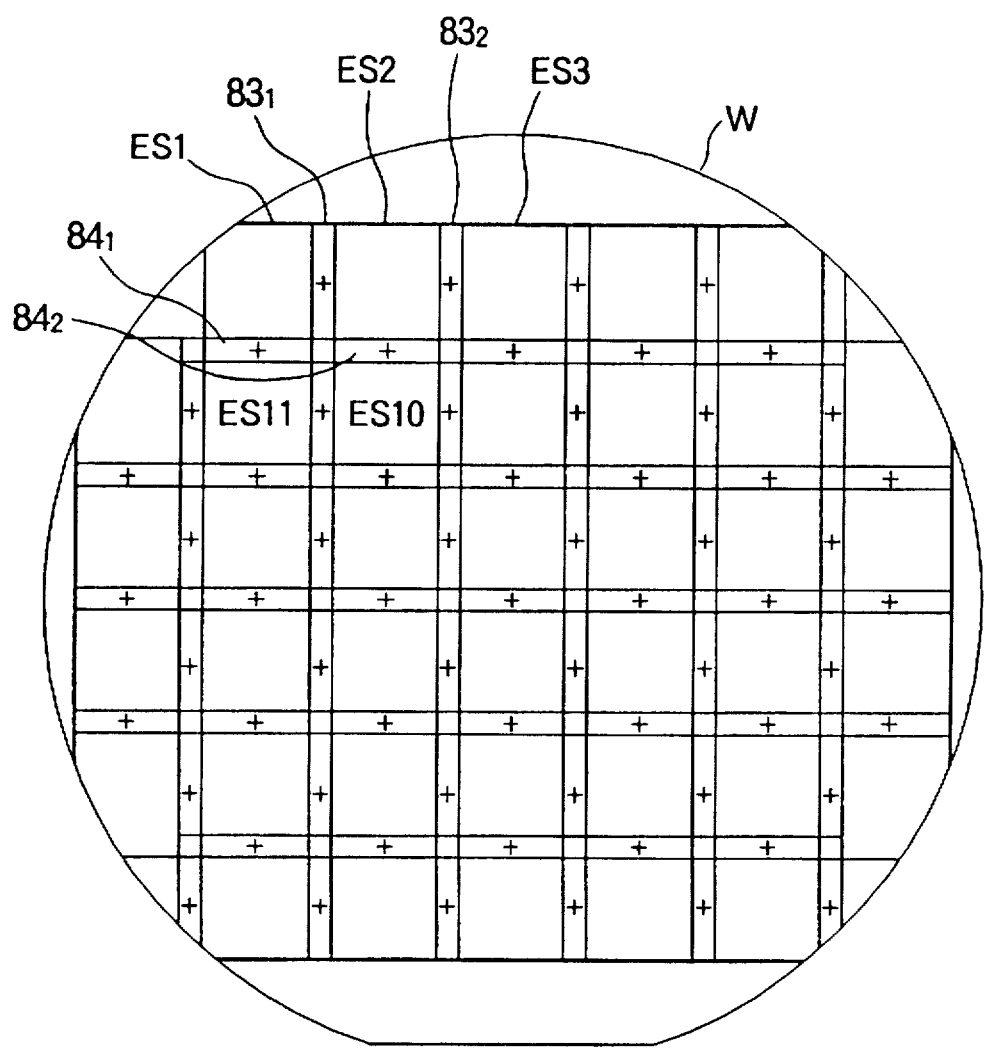
FIG. 35 is a plan view showing arrangement of shot areas in another conventional stepping accuracy measuring method.
Figure 36:
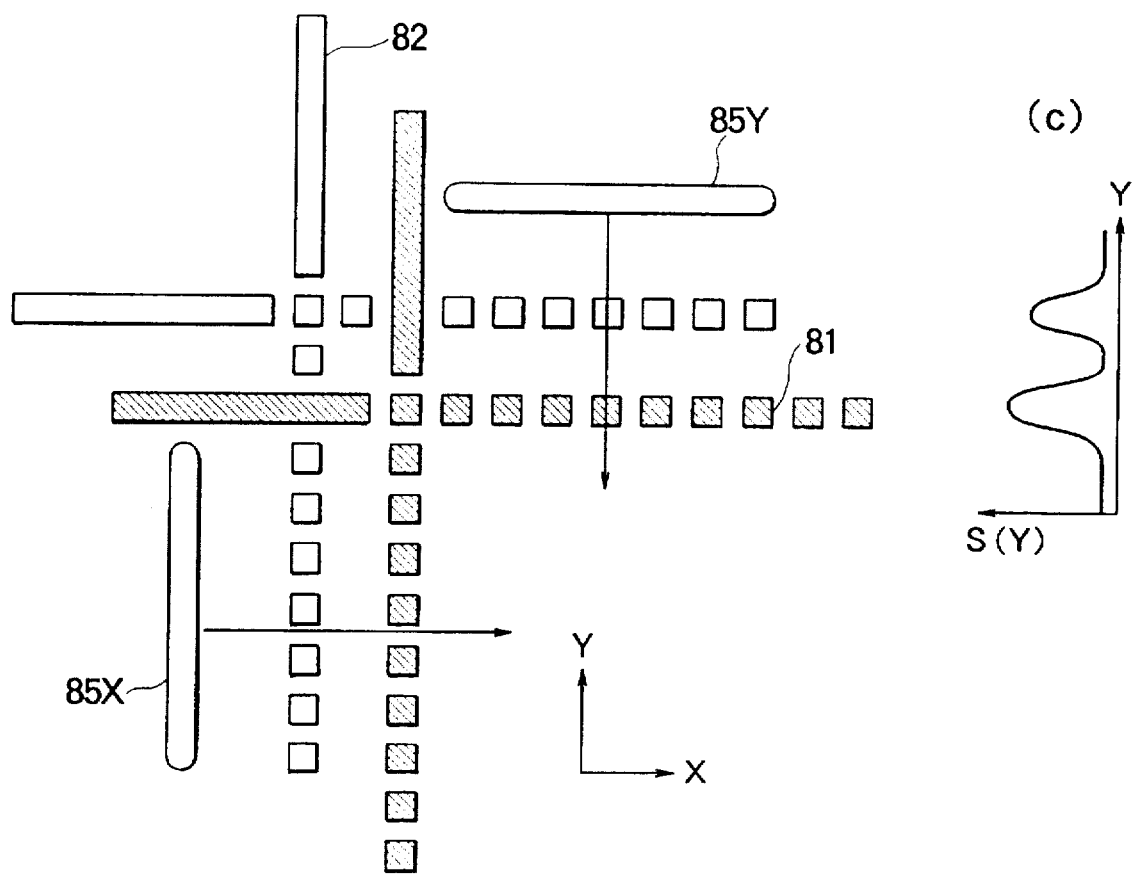
FIG. 36 is a schematic illustration for explaining the conventional stepping accuracy measuring method.
Figure 36:
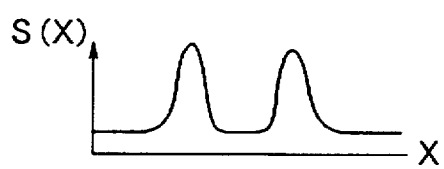

Before embodiments of the present invention are explained, conventional techniques will be explained with reference to FIGS. 34 to 36 in order to facilitate the understanding of the present invention.

First of all, a shot centering method which is one of conventional stepping accuracy measuring methods will be explained with reference to FIG. 34. In this method, a wafer is mounted on a wafer stage shiftable in X and Y directions, and then the wafer stage is shifted so that, as shown in FIG. 34, position measuring marks $81_1$, $81_2$, . . . are firstly exposed, as first exposure, at the centers of shot areas ES1, ES2, . . . which are regularly arranged on the wafer. Thereafter, position measuring marks $82_1$, $82_2$, . . . are repeatedly exposed at the centers of shot areas ES1, ES2, . . . on the wafer W as second exposure without dismounting the wafer W. In this case, the secondly exposed shot areas are deviated from the firstly exposed shot areas as shown by shot areas EQ1, EQ2, . . . due to a stepping error. Thereafter, the wafer W is developed, and then, arrangement accuracy of the shot areas which are arranged in a two-dimensional grid pattern is checked by measuring amounts of positional deviation between the firstly exposed position measuring marks $81_1$, $81_2$, . . . and the secondly exposed position measuring marks $82_1$, $82_2$, . . . . This measuring method is closely allied to the actual method for processing the wafer W.

Next, a shot periphery aligning method which is another conventional stepping accuracy measuring method will be explained with reference to FIG. 35. In this method, as shown in FIG. 35, position measuring marks are exposed onto peripheral portions of shot areas ES1, ES2, ES3, . . . , ES10, ES11, . . . regularly arranged on a wafer W so that the peripheral portions of the shot areas are overlapped with each other. Thereafter, the wafer W is developed, and amounts of positional deviation between the position measuring marks exposed onto the adjacent shot areas are measured regarding overlapped zones $83_1$, $83_2$, . . . overlapped in a horizontal direction and overlapped zones $84_1$, $84_2$, . . . overlapped in a vertical direction, respectively. In this way, a stepping error including yawing of a wafer stage caused during a stepping movement of the wafer stage and a positioning error in a shifting direction of the wafer stage can be obtained.

Next, a conventional method for measuring a relative positional deviation amount between the position measuring mark formed by the first exposure and the position measuring mark formed by the second exposure will be explained with reference to FIG. 36. In FIG. 36, the position measuring mark 81 (shown by a hatched zones) formed by the first exposure and the position measuring mark 82 formed by the second exposure are comprised of straight bars and following dot patterns arranged at predetermined pitches in X and Y directions, respectively, and the relative positional deviation amount between the position measuring marks 81, 82 is measured by an alignment system of TTL (through the lens) type using a projection optical system and of laser-step-alignment (LSA) type, for example.

In other words, as shown in FIG. 36(a), by scanning the wafer in a minus (−) X direction by moving it with respect to a slit-shaped light spot 85X (which is elongated in the Y direction) formed by converging laser beams, strong or intensive diffracted light is emanated along a predetermined direction when the light spot 85X passes across the dot patterns of the position measuring marks 81, 82. A diffraction intensity signal S(X) obtained by photoelectrically converting the diffracted light is a signal having two peaks as shown in FIG. 36(b). Thus, the positional deviation amount between the position measuring marks 81, 82 in the X direction can be detected on the basis of the difference between positions of the two peaks.

Similarly, by scanning the wafer in a minus (−) Y direction by moving it with respect to a slit-shaped light spot 85Y which is elongated in the X direction, intensive diffracted light is emanated along a predetermined direction when the light spot 85Y passes across the dot patterns of the position measuring marks 81, 82. By using a diffraction intensity signal S(Y) obtained by photoelectrically converting the diffracted light as shown in FIG. 36(c), the positional deviation amount between the position measuring marks 81, 82 in the Y direction can be detected. The above-mentioned positional deviation amounts between two position measuring marks 81, 82 in the X and Y directions represent the stepping error.

Since the exposure is actually effected in the above-mentioned conventional stepping accuracy measuring methods, they are suitable for evaluating the stepping accuracy in the projection exposure apparatus after the apparatus is assembled and adjusted. However, for example, if the conventional measuring method is used when the stepping accuracy of the wafer stage is adjusted, since it is necessary to repeat the exposure, development and measurement of the positional deviation amounts, thereby increasing the measuring time, the through-put for adjustment will be lowered. Further, since it is necessary to repeat the stepping accuracy measuring processes for a plurality of wafers in order to enhance the reliability of measurement, the through-put is further worsened.

Further, in the conventional stepping accuracy measuring methods, since the correspondence between the measured results and the factor(s) influencing the stepping accuracy is not clear, even when it is judged that the stepping accuracy is low, it cannot be determined which portion of the wafer stage should be adjusted, and, thus, it is obliged that the adjustment is effected by repeating trial and error. In other words, even when the conventional stepping accuracy measuring method is used upon adjustment of the wafer stage, the drive portion and other mechanisms of the wafer stage cannot be adjusted in an optimum sequence.

Now, a stepping accuracy measuring method according to the first embodiment of the present invention will be explained with reference to FIGS. 1 to 11.

Figure 1:
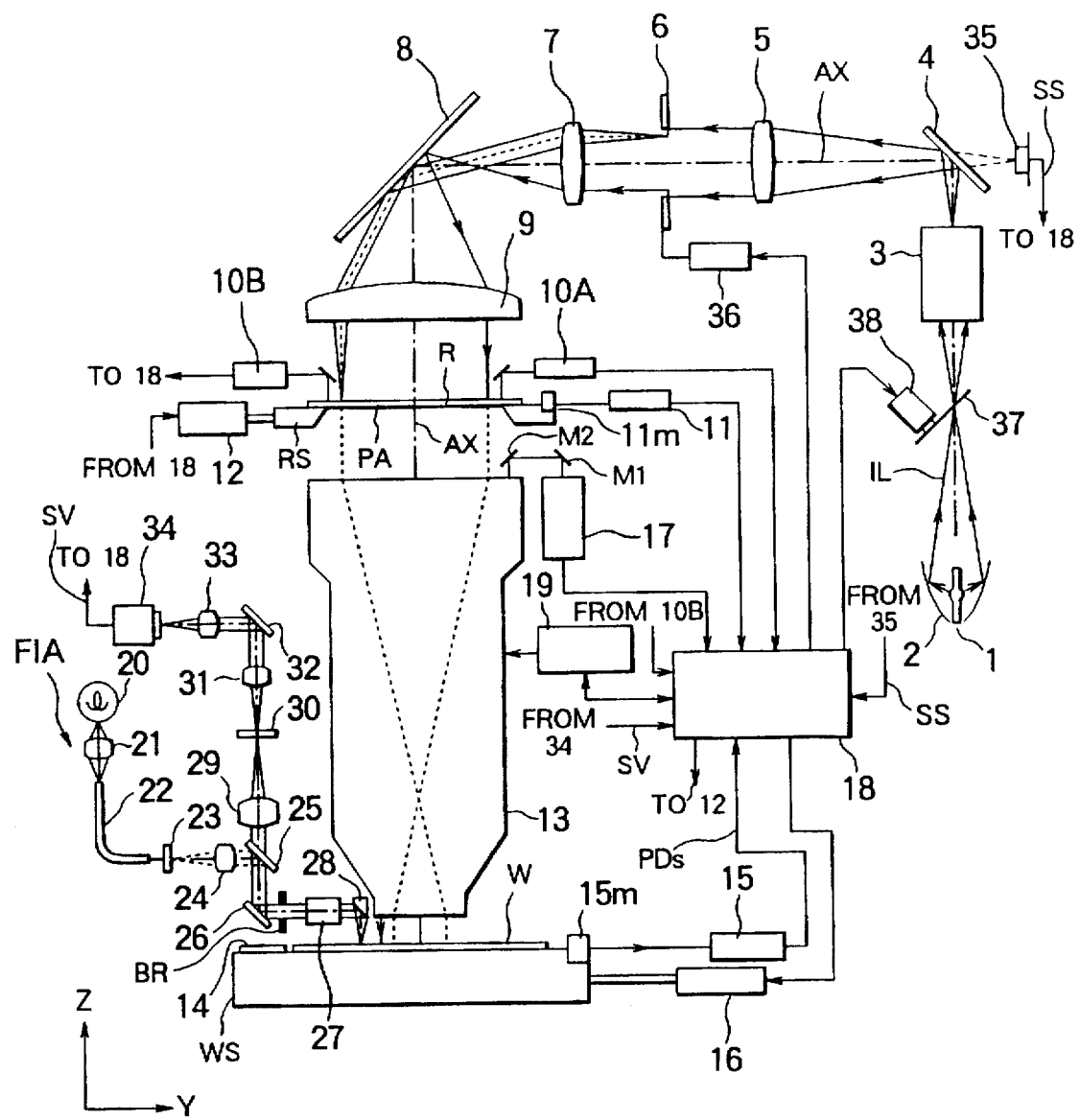
FIG. 1 is a schematic illustration of a projection exposure apparatus to which a stepping accuracy measuring method according to the present invention is applied.

FIG. 1 is a schematic illustration of a projection exposure apparatus to which the measuring method according to the first embodiment is applied. In FIG. 1, illumination light IL emitted from a super-high pressure mercury lamp 1 is reflected by an elliptic mirror 2 to be focused at the second focus of the mirror, and then is incident to an illumination optical system 3 including a collimator lens, an interference filter, an optical integrator (fly-eye lens), an aperture stop (a stop) and the like. Although not shown, the fly-eye lens is arranged in a plane perpendicular to an optical axis AX so that a focal plane thereof on the reticle side is substantially coincident with a Fourier transform plane (pupil conjugate plane) of a reticle pattern.

Further, in the proximity of the second focus of the elliptic mirror 2, there is arranged a shutter (for example, four-vane rotary shutter) 37 driven by a motor 38 to open and close a path for the illumination light IL. Incidentally, the exposure illumination light may be laser beams emitted from an excimer laser (KrF excimer laser, ArF excimer laser or the like) or high harmonics emitted from a metal vapor laser or a YAG laser, as well as bright beams emitted from the super-high pressure mercury lamp 1.

In FIG. 1, almost all of the illumination light (i-rays and the like) IL emitted from the illumination optical system 3 and having a wavelength band for sensitizing a photoresist layer is reflected by a beam-splitter 4, and then is incident to a mirror 8 through a first relay lens 5, a variable field stop (reticle blind) 6 and a second relay lens 7. The illumination light IL reflected toward a substantially downward vertical direction by the mirror 8 is projected onto a pattern area PA on a reticle R through a main condenser lens 9 at substantially uniform illumination. A plane on which the reticle blind 6 is positioned is a conjugate image focusing relation) with the pattern plane of the reticle R so that an illumination field of the reticle R can be appropriately determined by changing dimension and configuration of the aperture portion by opening and closing a plurality of movable blades forming the reticle blind 6 by means of a drive system 36.

Alignment marks comprised of two criss-cross light shielding marks are formed in the proximity of a periphery of the reticle R in an opposed relation. These two alignment marks are used upon alignment of the reticle R (for positioning the reticle with respect to an optical axis AX of a projection optical system 13).

The reticle R can be finely be shifted along a direction of the optical axis AX of the projection optical system 13 by means of a motor 12 and is mounted on a reticle stage RS which can be two-dimensionally shifted in a horizontal plane perpendicular to the optical axis AX and can be rotated finely. A movable mirror 11m for reflecting a laser beam from a laser light wave interference length measuring device (referred to as "laser interferometer" hereinafter) 11 is secured to an end of the reticle stage RS, so that a two-dimensional position of the reticle stage RS is always detected by the laser interferometer 11 at a resolving power of about 0.01 µm, for example. Reticle alignment systems (RA systems) 10A, 10B are arranged above the reticle R, and these RA systems 10A, 10B serve to detect two criss-cross alignment marks (not shown) formed in the proximity of outer periphery of the reticle R. On the basis of signals representing measurement from the RA systems 10A, 10B and by finely shifting the reticle stage RS, the reticle R is positioned so that a center of the pattern area PA is aligned with the optical axis AX of the projection optical system 13.

Moreover, the illumination light IL which has passed through the pattern area PA of the reticle R is incident to the double-side telecentric projection optical system 13, so that the projected image of the circuit pattern of the reticle R reduced by ⅕, for example, by the projection optical system 13 is projected (focused) onto the wafer W on which a photoresist layer is formed and a surface of which is substantially coincided with a best focusing plane of the projection optical system 13.

The wafer W is vacuum-held by a wafer holder (not shown) which can be rotated minutely, and is held on a wafer stage WS via the wafer holder. The wafer stage WS can be shifted two-dimensionally in a step-and-repeat way by means of a motor 16, so that, in normal exposure, when image-transfer exposure of the reticle R regarding one shot area on the wafer is completed, the wafer stage WS is steppingly driven up to a next shot position. A movable mirror 15m for reflecting a laser beam from a laser interferometer 15 is secured to an end of the wafer stage WS so that two-dimensional coordinate values of the wafer stage WS are always detected by the laser interferometer 15 with a resolving power of about 0.01 µm, for instance. The laser interferometer 15 serves to measure the coordinate values of the wafer stage WS in one direction (referred to as "X direction" hereinafter) perpendicular to the optical axis AX of the projection optical system 13 and in a Y direction perpendicular to both the optical axis and the X direction. In this way, the stage coordinate system (stationary coordinate system) (X,Y) of the wafer stage WS is determined by these coordinate values in the X and Y directions. That is to say, a coordinate value of the wafer stage WS measured by the laser interferometer 15 corresponds to a coordinate value of the stage coordinate system (X,Y).

Further, a reference member (glass substrate) 14 having reference marks used in the measurement of a baseline amount (described later) is provided on the wafer stage WS in such a manner that it is substantially flush with an exposure plane of the wafer W. As the reference marks, a slit pattern comprised of five sets of L-shaped light-permeable patterns, and two sets of reference patterns (having duty ratio of 1:1) made of light-reflectable chrome are formed on the reference member 14. One set of the reference patterns comprise diffraction grid marks arranged in three lows along the X direction (each low includes seven dot marks arranged in the Y direction), diffraction grid marks defined by three straight patterns arranged in the X direction, and twelve bar marks extending along the Y direction (these marks are arranged along the X direction). The other set of reference patterns have the same marks as the above-mentioned one set of the reference patterns, but are rotated by 90 degrees.

Now, in the illustrated embodiment, it is designed, as is the case in U.S. Pat. No. 4,780,616, so that the slit pattern formed on the reference member 14 is illuminated by illumination light (exposure light) transmitted below the reference member 14 by using an optical fiber (not shown) from the underside (from the interior of the wafer stage). The illumination light passed through the slit pattern of the reference member 14 serves to focus the projected image of the slit pattern onto a back surface (pattern surface) of the reticle R through the projection optical system 13. Further, the illumination light passed through either one of four reticle marks on the reticle R reaches the beam splitter 4 through the main condenser lens 9 and the relay lenses 7, 5, and the illumination light passed through the beam splitter 4 is incident to a photoelectric detector 35 arranged in the proximity of the pupil conjugate plane of the projection optical system 13. The photoelectric detector 35 serves to output a photoelectric signal SS corresponding to intensity of the illumination light to a main control system 18. Hereinbelow, the optical fiber (not shown), reference member 14 and photoelectric detector 35 are referred generically to as an "ISS system" (Imaging Slit Sensor system).

Further, in FIG. 1, there is provided an imaging characteristics correction portion 19. In the illustrated embodiment, the imaging characteristics correction portion 19 serves to correct imaging characteristics (for example, projecting magnification and distortion) of the projection optical system 13 by independently driving some of lens elements constituting the projection optical system 13 (particularly, several lens elements disposed near the reticle R) by using a piezo-electric element (to move it in a direction parallel with the optical axis AX or slant the same). A particular constitution of the imaging characteristics correction portion 19 is shown, for example, in U.S. Pat. No. 5,117,255.

Further, an alignment sensor of off-axis type (referred to as a "field image alignment system" (FIA system) hereinafter) is arranged at a side of the projection optical system. In this FIA system, light emitted from a halogen lamp 20 is transmitted, through a condenser lens 21 and an optical fiber 22, to an interference filter 23, where a photoresist-sensitive wavelength band and an infrared wavelength band are cut or removed from the light. The light passed through the interference filter 23 is incident to a telecentric objective lens 27 through a lens system 24, a beam splitter 25, a mirror 26 and a field stop BR. The light passed through the objective lens 27 is reflected by a prism (or mirror) 28 fixedly arranged near a peripheral portion of a lower end of a lens mount of the projection optical system 13, and the reflected light is directed on the wafer substantially vertically.

The light passed through the objective lens 27 is projected on a part of the surface (of the wafer W) including a wafer mark (ground mark) on the wafer W, and the light reflected from that part is incident to an index plate 30 through the prism 28, the objective lens 27, the field stop BR, the mirror 26, the beam splitter 25 and a lens system 29. The index plate 30 is arranged in a plane conjugate with the wafer W with respect to combination of the objective lens 27 and the lens system 29 so that an image of the wafer mark on the wafer W is focused within a transparent window of the index plate 30. Further, two straight marks extending in the Y direction and spaced apart from each other by a predetermined distance in the X direction are formed in the transparent window of the index plate 30 as indication marks. The light passed through the index plate 30 is incident to an imaging element (CCD camera and the like) 34 through a first relay lens system 31, a mirror 32 and a second lens system 33 so that the image of the wafer mark and images of the indication marks are focused on a light receiving surface of the imaging element 34. An imaging signal SV emitted from the imaging element 34 is supplied to the main control system 18, where a position (coordinate value) of the wafer mark in the X direction is calculated. Incidentally, as well as the above-mentioned FIA system (for X-axis), there is also provided another FIA system for detecting a position of the wafer mark in the Y direction.

Further, an alignment sensor 17 of TTL (through the lens) type is arranged on one side of an upper portion of the projection optical system 13, and position detecting light emitted from the alignment sensor 17 is incident to the projection optical system 13 through mirrors M1, M2. The position detecting light is directed onto the wafer mark on the wafer W through the projection optical system 13. Light reflected from the wafer mark is returned to the alignment sensor 17 through the projection optical system 13 and the mirrors M2, M1. The reflected light returned to the alignment sensor 17 is photoelectrically converted into a signal from which the position of the wafer mark on the wafer W can be determined.

Figure 2:
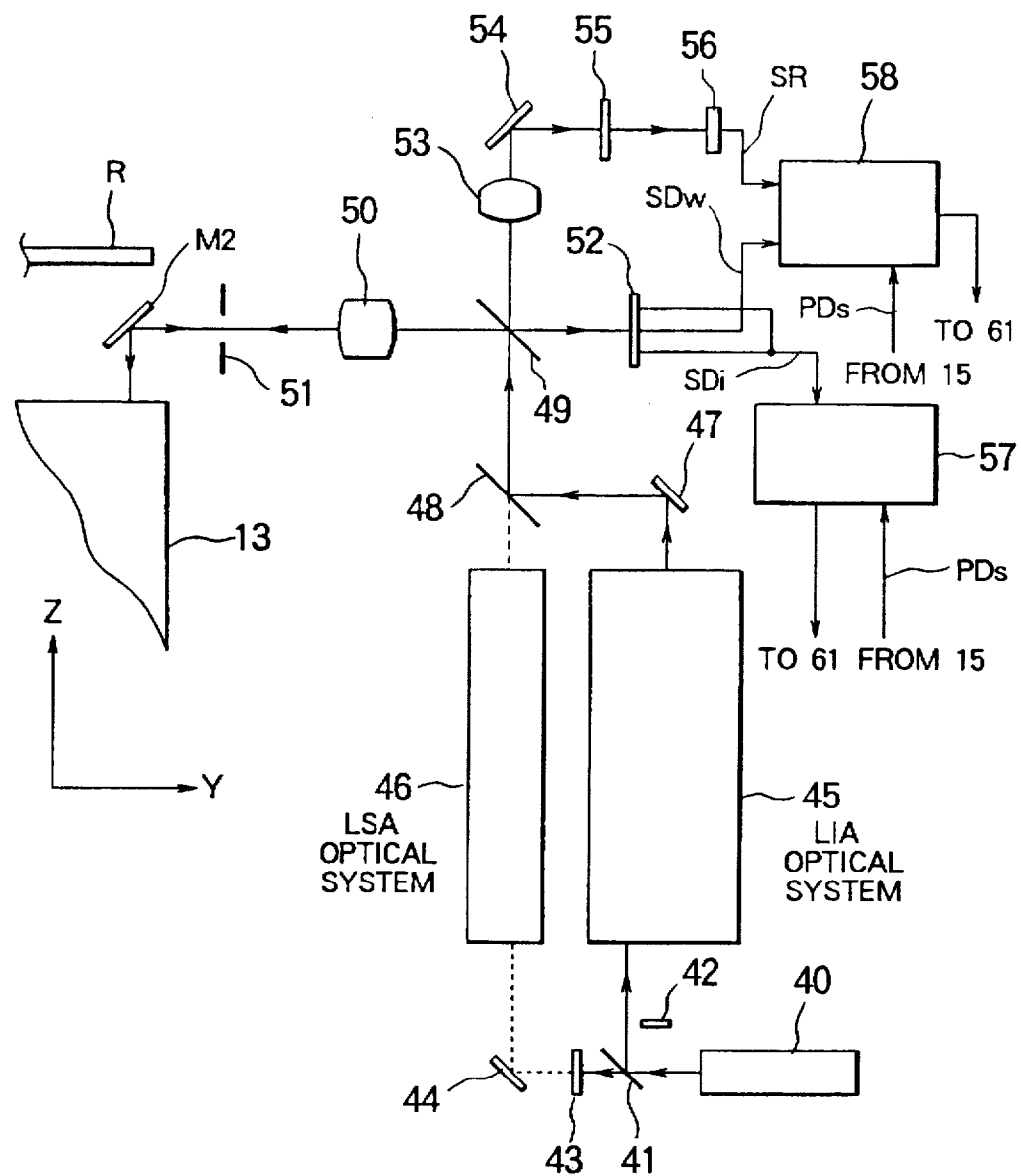
FIG. 2 is a block diagram showing a TTL system alignment sensor 17 of the apparatus of FIG. 1 in detail.

FIG. 2 shows the alignment sensor 17 of TTL type in detail. In an example shown in FIG. 2, the alignment sensor 17 is constituted by combining an alignment system of two-light flux interference type (referred to as "LIA system" hereinafter) and an alignment system of laser-step-alignment type (referred to as "LSA system" hereinafter) in such a manner that optical members of both systems can be commonly used as much as possible. Although a brief explanation of the alignment sensor 17 is explained below, it should be noted that the details of such an alignment sensor is disclosed in U.S. Pat. No. 5,151,750.

In FIG. 2, a laser beam emitted from a light source (He-Ne laser source and the like) 40 is divided by a beam splitter 41. A laser beam reflected by the beam splitter is incident to a first beam forming optical system (LIA optical system) 45 through a shutter 42; whereas, a laser beam passed through the beam splitter 41 is incident to a second beam forming optical system (LSA optical system) 46 through a shutter 43 and a mirror 44. Accordingly, by driving the shutters 42, 43 appropriately, the LIA system can be switched to the LSA system or vice versa.

The LIA optical system 45 includes two sets of acousto-optic modulators and the like so that two laser beams having a predetermined difference $\Delta f$ in frequency are emitted substantially symmetrically with respect to an optical axis of the LIA optical system. The two laser beams emitted from the LIA optical system 45 reach a beam splitter 49 through a mirror 47 and a beam splitter 48. Two laser beams passed through the beam splitter 49 are incident to a reference diffraction grid 55 (secured to the apparatus) through a lens system (inverse Fourier transformation lens) 53 and a mirror 54 from two different directions having a predetermined intersecting angle therebetween so that the beams are focused (intersect) on the diffraction grid. A photoelectric detector 56 serves to receive interference light attained by interference between the diffracted lights passed through the reference diffraction grid 55 and generated substantially in the same direction and outputs a sine-wave photoelectric signal SR corresponding to intensity of the diffracted lights to an LIA calculation unit 58 of the main control system 18 (FIG. 1).

On the other hand, two laser beams reflected by the beam splitter 49 once cross with each other or intersect at an aperture portion of a field stop 51 by means of an objective lens 50 and then are incident to the projection optical system 13 through the mirror M2 (mirror M1 shown in FIG. 1 is not shown in FIG. 2). Further, the two laser beams incident to the projection optical system 13 are once focused or condensed as a light spot on the pupil surface of the projection optical system 13 substantially symmetrically with respect to the optical axis AX, and then are incident to the wafer mark from two different directions (having a predetermined intersecting angle therebetween) as parallel light fluxes symmetrically inclined on both sides of the optical axis AX with respect to a pitch direction (Y direction) of the wafer mark on the wafer W. One-dimensional interference fringes moving at a speed corresponding to the difference Δf in frequency are formed on the wafer mark, and ± first order diffraction lights (interference light) generated along the same direction (direction of the optical axis) from the wafer mark are incident to a photoelectric detector 52 through the projection optical system 13 and an objective lens 50. The photoelectric detector 52 serves to output a sine-shaped photoelectric signal Sdw according to a period of bright/dark change of the interference fringes to an LIA calculation unit 58. The LIA calculation unit 58 serves to calculate the positional deviation of the wafer mark on the basis of a difference in wave phase between two photoelectric signals SR, SDw, to determine the coordinate position of the wafer stage WS by using a position signal PDs from the laser interferometer 15 and to output the data regarding the positional deviation amount and the coordinate position to an alignment data memory portion 61 (refer to FIG. 3).

On the other hand, the LSA optical system 46 includes a beam expander, a cylindrical lens and the like, and a laser beam emitted from the LSA optical system 46 is incident to the objective lens 50 through the beam splitters 48, 49. Further, the laser beam emitted from the objective lens 50 is once converged into a slit pattern at an aperture portion of the field stop 51 and then is incident to the projection optical system 13 through the mirror M2. The laser beam incident to the projection optical system 13 passes through a center of the pupil surface of the projection optical system and is then projected onto the wafer W as an elongated strip-shaped spot light which is elongated in the X direction in an image field of the projection optical system 13 and directed toward the optical axis AX.

When the spot light and the wafer mark (diffraction grid mark) on the wafer W are shifted relative to each other along the Y direction, light generated from the wafer mark is received by the photoelectric detector 52 through the projection optical system 13 and the objective lens 50. The photoelectric detector 52 serves to photoelectrically convert the lights of ± first to third order diffraction only (among the diffraction lights from the wafer mark) into a photoelectric signal SDi corresponding to intensity of the light, which is in turn sent to an LSA calculation unit 57 of the main control system 18. A position signal PDs from the laser interferometer 15 is also supplied to the LSA calculation unit 57. The LSA calculation unit 57 serves to effect the sampling of the photoelectric signal SDi in timed relation to up-down pulses each of which is generated when the wafer stage WS is moved by a unit shift amount. Further, the LSA calculation unit 57 serves to convert the sampling values into digital values which are in turn stored in the memory sequentially according to address numbers, to calculate the position of the wafer mark in the Y direction by performing a predetermined calculation process and to output the data regarding the calculated position to the alignment data memory portion 61 shown in FIG. 3.

Next, the main control system 18 of FIG. 1 will hereinafter be explained.

Figure 3:
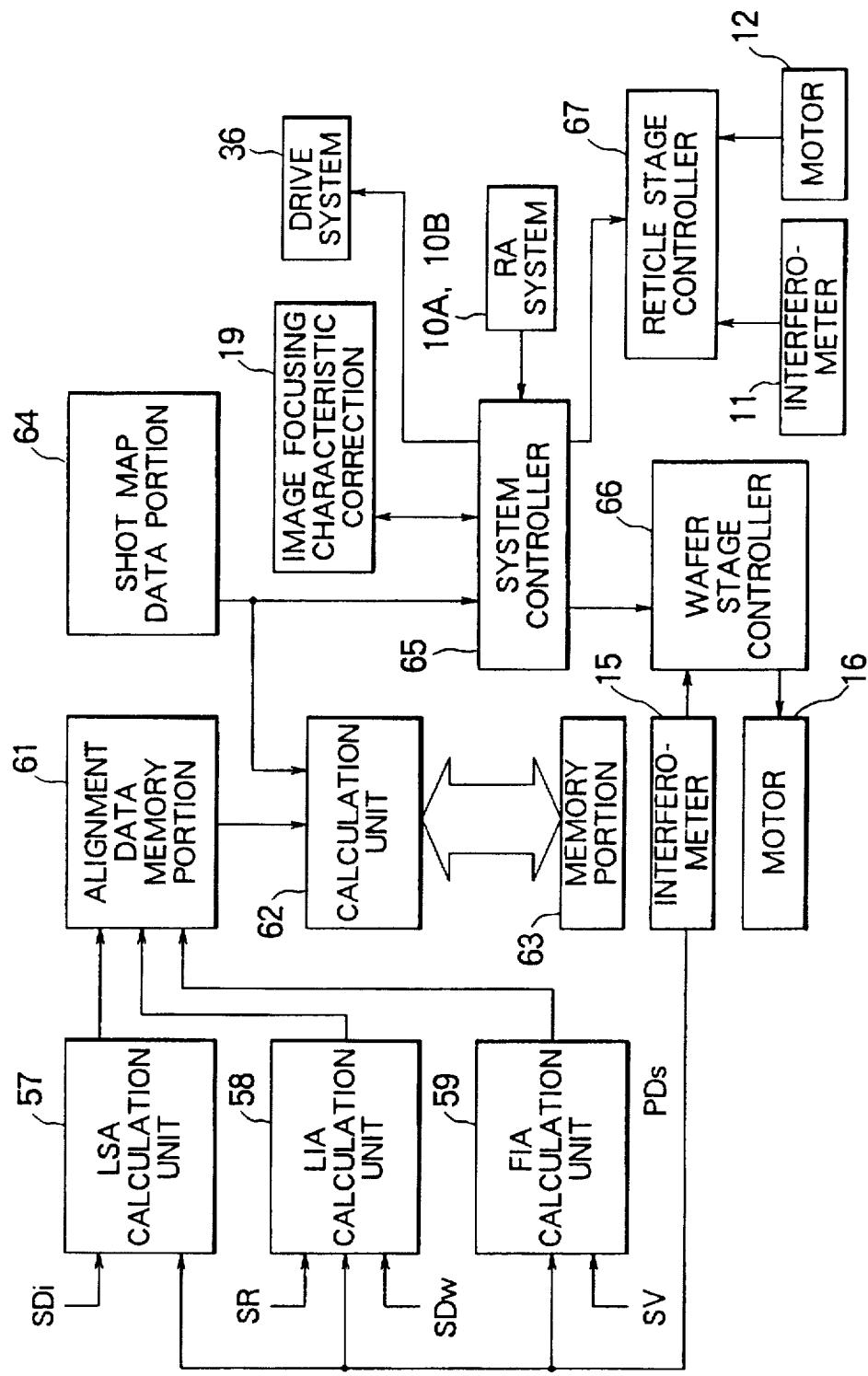
FIG. 3 is a block diagram showing a main control system and other elements of the apparatus of FIG. 1 in detail.

FIG. 3 shows the main control system 18 and elements associated therewith. In FIG. 3, the main control system 18 is constituted by the LSA calculation unit 57, LIA calculation unit 58, FIA calculation unit 59, alignment data memory portion 61, calculation unit 62, memory portion 63, shot map data portion 64, system controller 65, wafer stage controller 66 and reticle stage controller 67. Among these elements, the LSA calculation unit 57, the LIA calculation unit 58 and the FIA calculation unit 59 serve to calculate positional deviation amounts of the wafer marks and the coordinate position (X,Y) of the wafer stage WS when the positional deviation amount is detected on the basis of the photoelectric signals supplied to these units. The data or information regarding the positional deviation amounts and the coordinate positions is supplied to the alignment data memory portion 61. The information regarding the positional deviation amounts and the coordinate positions stored in the alignment data memory portion 61 is supplied to the calculation unit 62.

Arrangement coordinate values (designed values) of the wafer marks included in the shot areas on the wafer W with respect to the coordinate system (x,y) on the wafer W are stored in the shot map data memory portion 64, and such designed arrangement coordinate values are supplied to the system controller 65. The system controller 65 serves to determine the arrangement coordinate values of the wafer marks with respect to a stage coordinate system (X,Y) by utilizing conversion coefficient for the conversion from the wafer coordinate system (x,y) to the stage coordinate system (X,Y). Further, the system controller 65 controls to drive the wafer stage WS of FIG. 1 by means of the motor 16 while monitoring the measured value of the laser interferometer 15 through the wafer stage controller 66 on the basis of the arrangement coordinate values, thereby positioning each of areas (on the wafer W) to be measured or to be exposed and actually exposing the areas to be exposed. Further, the system controller 65 controls to drive the reticle stage RS of FIG. 1 by means of the motor 12 while monitoring the measured value of the laser interferometer 11 through the reticle stage controller 67, thereby adjusting the position of the reticle R.

The calculation unit 62 serves to determine the stepping error on the basis of the data regarding the positional deviation amounts and the coordinate values (X,Y) of the wafer stage WS stored in the alignment data memory portion 61. This operation will be described later. The stepping error is stored in the memory portion 63.

Now, the alignment system will be explained by using an example that the LIA optical system 45 of the alignment sensor 17 is used. When the wafer stage WS is stopped, two laser beams (heterodyne beams) having different frequencies emitted from the LIA optical system 45 are directed onto the diffraction grid wafer mark on the wafer W through the projection optical system 13, so that + (plus) first order diffraction light of the first laser beam and − (minus) first order diffraction light of the second laser beam are emitted in parallel from the wafer W substantially in an upward vertical direction. By photoelectrically converting the interference light resulted from the ± first order diffraction lights, a beat signal a phase of which is modulated in accordance with the position of the wafer mark is detected. On the basis of a difference in phase between the beat signal and a reference beat signal, the positional deviation amount of the wafer mark from the reference position is detected.

Figure 4:
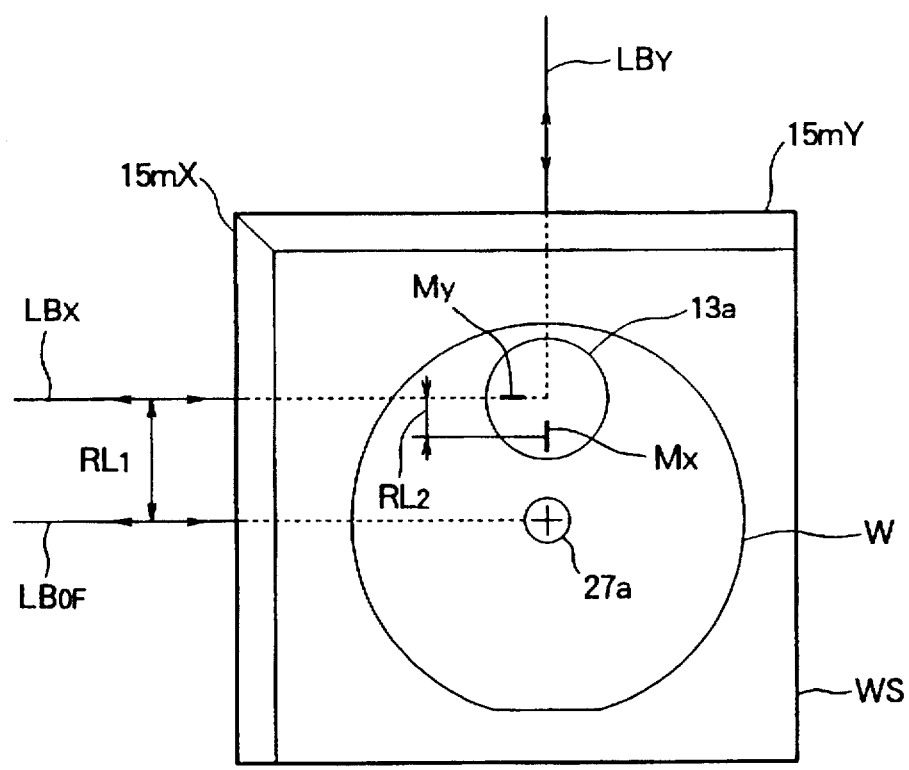
FIG. 4 is a plan view showing a relation between a measuring beam of a laser interferometer and a wafer stage WS.

FIG. 4 shows a positional relation between a detection position of the LIA optical system 45 of the alignment sensor 17 and the laser beams from the laser interferometer 15 of FIG. 1. In FIG. 4, two laser beams $LB_X$, $LB_{OF}$ sent from two interference length measuring portions (not shown) are directed onto the movable mirror 15mX used in shifting the wafer stage WS in the X direction (these laser beams are in parallel with the X-axis and a distance between these laser beams is $RL_1$) so that an extension line of the laser beam $LB_X$ intersects the optical axis of the projection optical system 13 (an exposure field 13a of the projection optical system 13 in FIG. 4) and an extension line of the laser beam $LB_{OF}$ intersects an axis of the objective lens 27 of the FIA system of off-axis type shown in FIG. 1 passing through a center of an observation field 27a. Similarly, a laser beam $LB_Y$ from an interference length measuring portion (not shown) is directed onto the movable mirror 15mY used in shifting the wafer stage WS in the Y direction along a direction parallel to the Y-axis so that an extension line of the laser beam $LB_Y$ intersects the optical axis of the projection optical system 13. One particular form of the interferometer system of FIG. 4 is disclosed in U.S. Pat. No. 5,003,342.

On the basis of results of the length-measurements effected by the laser beams $LB_X$, $LB_Y$, the values in two-dimensional coordinates (X,Y) of the wafer stage WS are determined at the optical axis of the projection optical system 13. Since these laser beams $LB_X$, $LB_Y$ intersect each other on the optical axis of the projection optical system 13, there is no Abbe error when the coordinate values of the wafer stage WS are measured. Further, the two-dimensional coordinate values of the wafer stage WS at a predetermined reference point in the observation field of the FIA system of off-axis type are measured by the laser beams $LB_{OF}$, $LB_Y$ in such a manner that no Abbe error occurs. In addition, the yawing of the wafer stage WS is determined by a difference between the length-measured result by means of the laser beam $LB_X$ and the length-measured result by means of the laser beam $LB_{OF}$.

Further, in FIG. 4, the position detecting heterodyne beam from the LIA optical system 45 of FIG. 2 is directed onto a measuring point Mx positioned in the proximity of a periphery of the exposure field 13a of the projection optical system 13 and extending in the Y direction and the heterodyne beam from the Y-axis measuring LIA optical system is directed onto a measuring point My positioned in the proximity of the periphery of the exposure field 13a and extending in the X direction. The measuring point Mx is spaced apart from the center of the exposure field 13a by a distance of $RL_2$ toward the observation field 27a and the measuring point My is also spaced apart from the center of the exposure field by a distance of $RL_2$ toward the movable mirror 15mX.

Figure 5A:
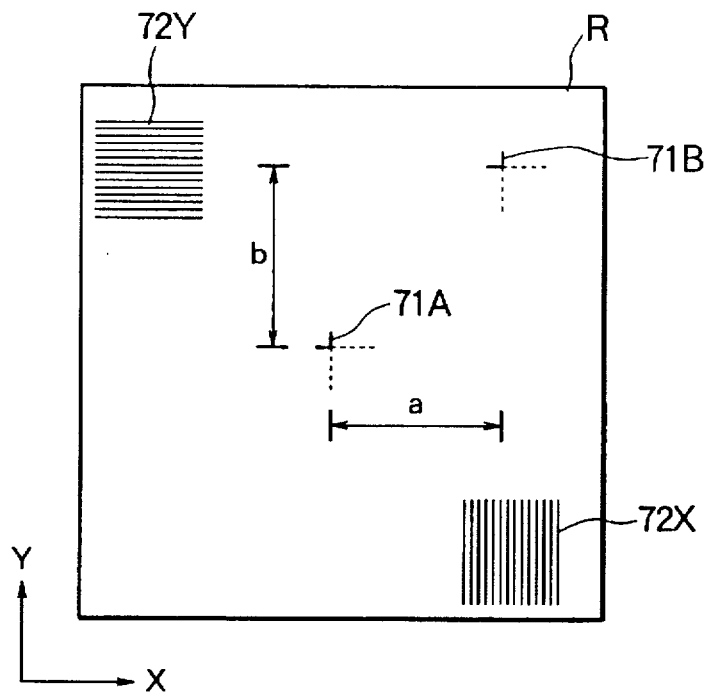
FIG. 5A is a plan view showing patterns of a reticle R used in the present invention.
Figure 5B:
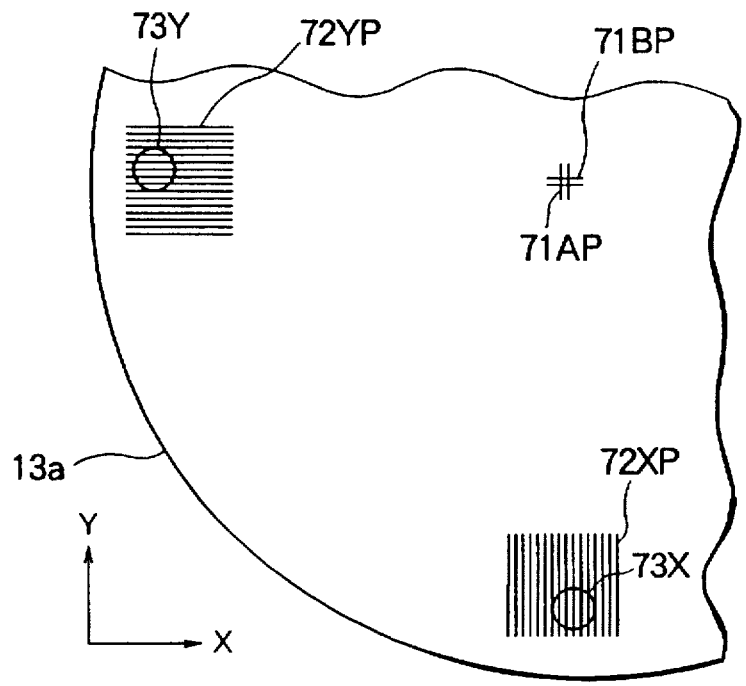
FIG. 5B is a partial view showing projected patterns of the reticle R.

Next, the reticle used in the illustrated embodiment will be explained with reference to FIGS. 5A and 5B. FIG. 5A shows patterns positioned in the pattern area of the reticle R. In FIG. 5A, a position measuring mark 71A is formed on a central portion of the reticle R and a position measuring mark 71B is formed on the reticle in a place apart from the position measuring mark 71A by distance "a" in the X direction and distance "b" in the Y direction. The position measuring marks 71A, 71B are the same as the original mask pattern of the position measuring marks 81 and 82 shown in FIG. 36 and already explained in connection with the conventional technique. Accordingly, positions of projected images of the position measuring marks 71A, 71B can be detected by the method explained in connection with FIG. 36, i.e., a method using the LSA optical system 46 of FIG. 2 according to the illustrated embodiment (laser-step-alignment system).

Further, a grid-shaped position measuring mark (referred to as "LIA measuring mark" hereinafter) 72X comprised of a plurality of parallel bars spaced apart from each other at a predetermined pitch in the X direction is formed on the reticle on a Y-direction extension line of the dot pattern of the position measuring mark 71B extending in the Y direction, and a grid-shaped LIA measuring mark 72Y comprised of a plurality of parallel bars spaced apart from each other at a predetermined pitch in the Y direction is formed on the reticle on an X-direction extension line of the straight pattern of the position measuring mark 71B extending in the X direction. When the patterns on the reticle shown in FIG. 5A are exposed onto the wafer W through the projection optical system 13 and developed, as shown in FIG. 5B, an image 71AP of the position measuring mark 71A is formed on the central portion of the exposure field 13a of the projection optical system 13. Assuming that the projection magnification of the projection optical system is β, when the wafer stage WS is shifted in the X direction by a distance of β·a and in the Y direction by a distance of β·b from a condition that the position measuring mark 71AP is positioned at the center of the exposure field 13a, as shown in FIG. 5B, an image 71BP of the position measuring mark 71B is shifted to the center of the exposure field 13a and an image 72XP of the LIA measuring mark 72X and an image 72YP of the LIA measuring mark 72Y are shifted to the peripheral portion of the exposure field 13a. Hereinbelow, for simplification, the images 71AP, 71BP of the position measuring marks are also called as "position measuring marks", and the images 72XP, 72YP of the LIA measuring marks are also referred to as "LIA measuring marks".

Incidentally, although the reticle patterns are actually focused onto the wafer W as inverted images by means of the projection optical system 13, in order to facilitate the understanding of the present invention, hereinbelow, it is assumed that erect images of the reticle patterns are focused onto the wafer W by means of the projection optical system 13. The heterodyne beam from the LIA optical system 45 of the alignment sensor 17 of FIG. 2 is directed onto the LIA measuring mark 72XP of FIG. 5B as a beam spot 73X, and the heterodyne beam from the Y-axis measuring LIA optical system (not shown) is directed onto the LIA measuring mark 72YP as a beam spot 73Y. Consequently, the positional deviation amount of the LIA measuring mark 72XP in the X direction and the positional deviation amount of the LIA measuring mark 72YP in the Y direction can be detected by the LIA method (two-light-flux interference system), respectively. The LIA measuring marks 72XP, 72YP are grid-shaped marks having a size sufficient to take into consideration the fact that the detection system including the LIA optical system 45 and associated element has some installation error.

The stepping accuracy is measured by using the reticle R shown in FIG. 5A in the following manner. In other words, first of all, the wafer W on which non-exposed photoresist is coated is rested on the wafer stage WS of FIG. 1, and then the pattern images of the reticle R of FIG. 5A are successively and regularly projected on the wafer W, and lastly, the wafer W is developed.

Figure 6:
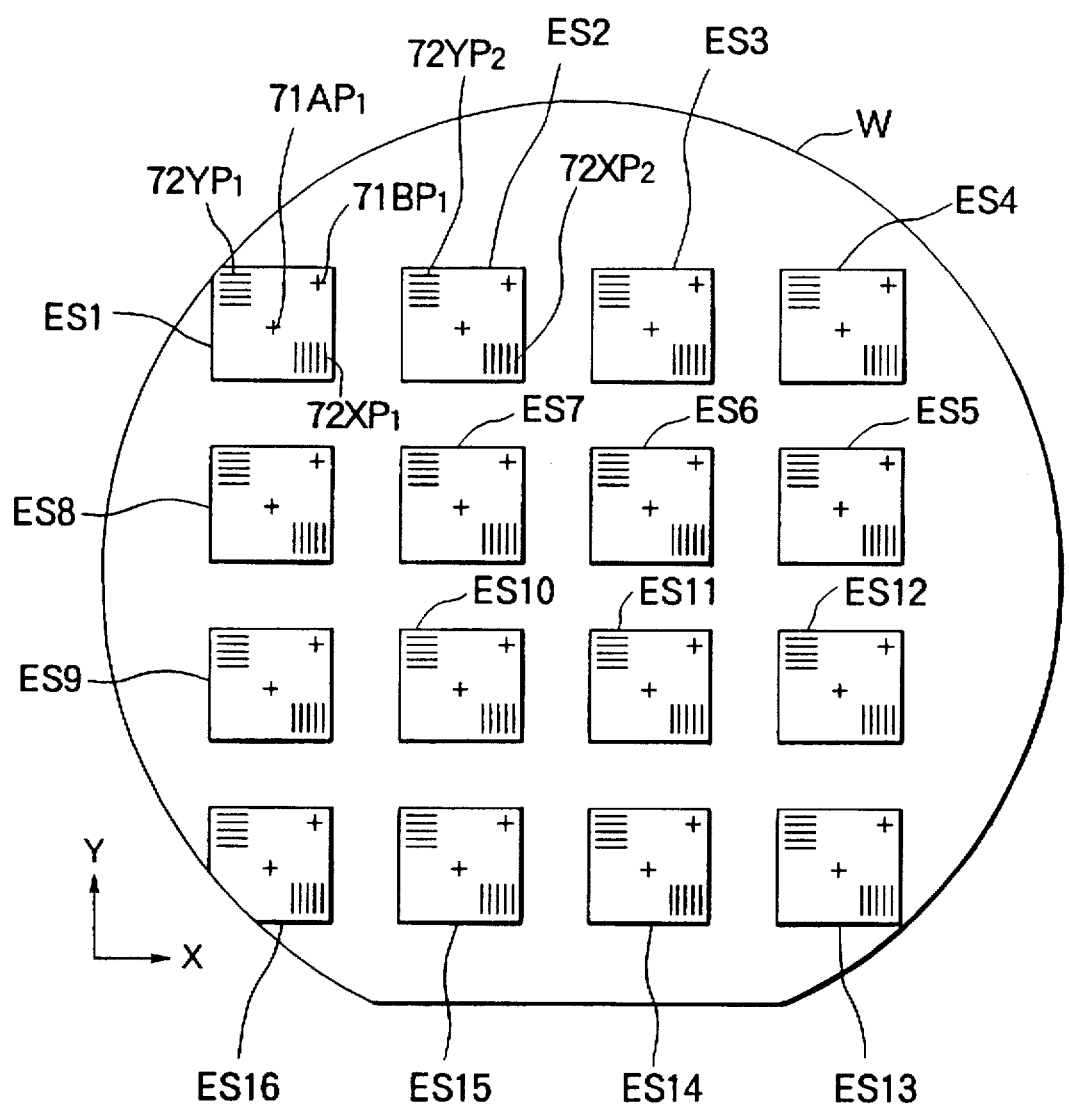
FIG. 6 is a plan view showing arrangement of shot areas on a wafer W to be measured.

FIG. 6 shows an arrangement of the shot areas on the wafer W after development. In FIG. 6, sixteen shot areas ES1, ES2, . . . , ES16 (spaced apart from each other by a constant pitch in X and Y directions) are formed on the wafer W, and the pattern images of the reticle R of FIG. 5A are formed on each of shot areas ESi (i=1–16) as uneven (raised and depressed portions) patterns. For example, position measuring marks $71AP_1$, $71BP_1$ and LIA measuring marks $72XP_1$, $72YP_1$ are formed on the first shot area ES1. As already explained in connection with FIG. 5B, upon the exposure regarding the first shot areas ES1, the position measuring mark $71AP_1$ is positioned at the center of the exposure field. However, as will be described later, when the wafer stage WS is steppingly driven to detect the position of the shot area ES1, the position measuring mark $71BP_1$ is positioned at the center of the exposure field so that the heterodyne beams from the LIA optical systems are directed to the LIA measuring marks 72XP, 72YP.

Then, the wafer W of FIG. 6 for which the exposure and development has been finished is rested on the wafer stage WS of FIG. 1 again, and, by driving the wafer stage WS steppingly, as shown in FIG. 7(a), the positions of the LIA measuring marks of the shot areas ES13, . . . , ES16, ES9, ES12, ES5, . . . , ES4 are successively detected by the LIA system in this order. In this case, on the basis of the arrangement data of the shot areas ESi (i=1–16) on the wafer W of FIG. 6, the position measuring marks ($71BP_1$, etc) at the right upper corners of the shot areas ESi are successively positioned at the center of the exposure field of the projection optical system 13 and the wafer stage WS is successively stopped there. In a condition whereby the wafer stage WS is stopped, the coordinate values $X_{Ai}$, $Y_{Ai}$, $OF_{Ai}$ measured by the laser beams $LB_X$, $LB_Y$, $LB_{OF}$, the positional deviation amounts $x_{Ai}$ of the X-axis LIA measuring marks ($72XP_1$, etc) detected by the LIA system, the positional deviation amounts $y_{Ai}$ of the Y-axis LIA measuring marks ($72YP_1$, etc) detected by the Y-axis LIA system, a room temperature, humidity, ambient pressure, correction values of the interferometers (correction values of the wavelengths of the laser beams depending on the temperature and the like) and torque values of the drive system for the wafer stage WS are sampled. Incidentally, the coordinate values measured by the laser beams $LB_X$, $LB_Y$, $LB_{OF}$ and the detected results obtained by the LIA system are sampled with a time interval of 2 msec, and the measured results are averaged. The other values are sampled once per each of shot areas ESi by a time duration corresponding to the actual exposure time.

Then, after the above-mentioned first measurement is finished, a second measurement is effected without dismounting the wafer W from the wafer stage WS. Also in the second measurement, by driving the wafer stage WS steppingly, as shown in FIG. 7(b), the positions of the LIA measuring marks of the shot areas ES13, . . . , ES4 are successively detected by the LIA system in the same sequence as that of the first measurement. Also in the second measurement, for each of the shot areas ESi (i=1–16), the coordinate values $X_{Bi}$, $Y_{Bi}$, $OF_{Bi}$ measured by the laser beams $LB_X$, $LB_Y$, $LB_{OF}$, the positional deviation amounts $x_{bi}$ of the X-axis LIA measuring marks ($72XP_1$, etc) detected by the LIA system, the positional deviation amounts $y_{Bi}$ of the Y-axis LIA measuring marks ($72YP_1$, etc) detected by the LIA system, the room temperature, humidity, ambient pressure, the correction values of the interferometers (correction values of the wavelengths of the laser beams depending on the temperature and the like) and the torque values of the drive system for the wafer stage WS are sampled.

Thereafter, factors affecting the stepping error are determined by analyzing the measured results obtained by the first and second measurements. First of all, the error (stepping error) generated when the wafer stage WS is driven steppingly is determined by a value obtained by subtracting the measured result of the second measurement (shown by the suffix "B") from the measured result of the first measurement (shown by the suffix "A"). Accordingly, when the stepping errors of the measured coordinate values measured by the laser beams $LB_X$, $LB_Y$, $LB_{OF}$ are represented by $\Delta X_i$, $\Delta Y_i$, $\Delta OF_i$, respectively, and the stepping errors of the positional deviation amounts of the X-axis LIA measuring marks detected by the LIA system and the stepping errors of the positional deviation amounts of the Y-axis LIA measuring marks detected by the LIA system are represented by $\Delta x_i$, $\Delta y_i$, respectively, these stepping errors are represented by the following equations:

$$\Delta X_i = X_{Bi} - X_{Ai}, \ \Delta Y_i = Y_{Bi} - Y_{Ai}, \ \Delta OF_i = OF_{Bi} - OF_{Ai} \quad (1)$$

$$\Delta x_i = x_{Bi} - x_{Ai}, \ \Delta y_i = y_{Bi} - y_{Ai} \quad (2)$$

Similarly, the stepping error regarding the room temperature, etc. is determined by the difference calculation. These stepping errors can be grouped by the following factors:

① an offset error ($\Delta X_i$, $\Delta Y_i$) of the measured results obtained by the laser interferometers: this error can be regarded as a stage control error of the wafer stage WS;

② ($\Delta OF_i - \Delta X_i$)/(distance $RL_1$ between the laser beams $LB_X$ and $LB_{OF}$): this error can be regarded as the yawing error of the wafer stage WS;

③ ($\Delta x_i$, $\Delta y_i$)−($\Delta X_i$, $\Delta Y_i$)−YAW·$RL_2$, YAW·$RL_2$) (Incidentally, YAW is the yawing error, and $RL_2$ is a distance between the LIA measuring beam and the exposure center as shown in FIG. 4): this error can be regarded as an error caused by fluctuation of air and as an error of the laser interferometer;

④ a stepping error caused by the temperature, humidity, air pressure, and the correction value of the wavelength of the laser interferometer: this error can be regarded as a correction error of the measured result of the laser interferometer; and ⑤ a stepping error of the torque value of the drive system for the wafer stage WS: this error can be considered to be an error of stage control accuracy for the wafer stage WS.

Since the entire stepping error is the sum of the above-mentioned factors grouped into ①–⑤, by adjusting the worst factor which has a value mostly different from the predetermined reference value, it is possible to improve the stepping accuracy effectively.

Figure 7:
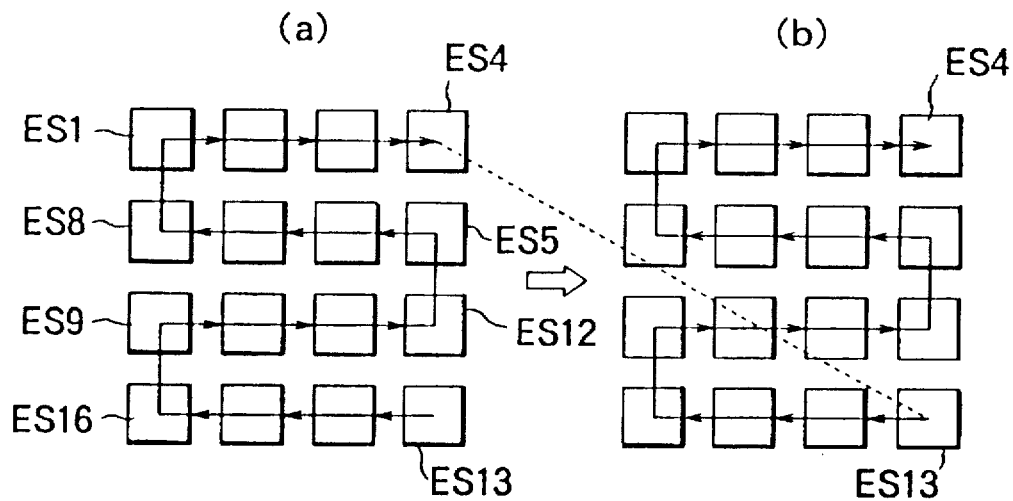
FIG. 7 is a view showing an example of a first measuring sequence and a second measuring sequence, respectively, according to the first embodiment of the present invention.
Figure 8:
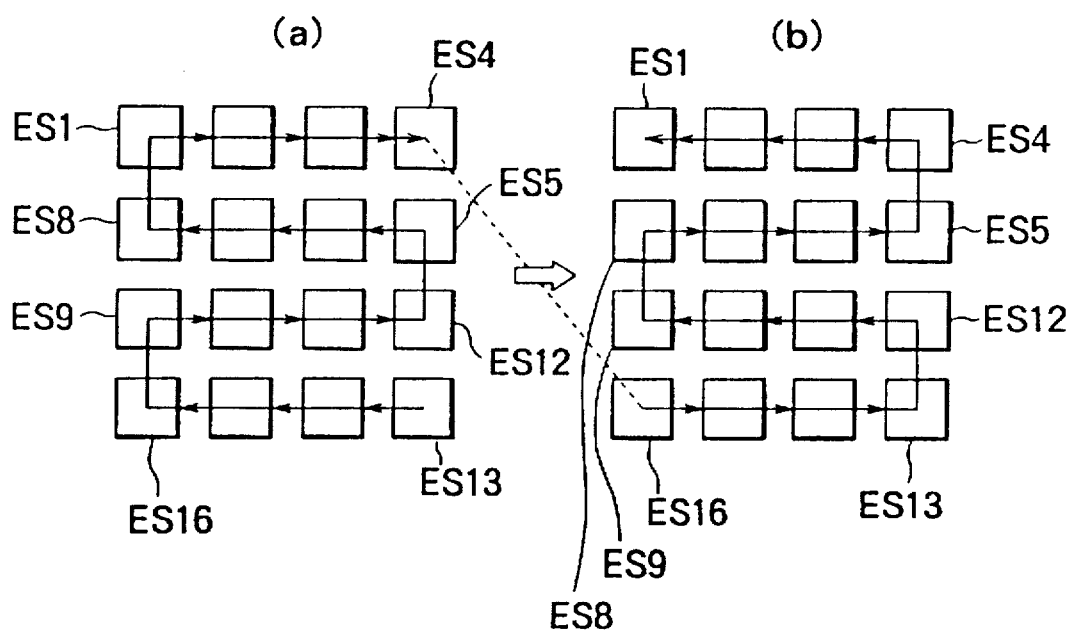
FIG. 8 is a view showing another example of the first measuring sequence and the second measuring sequence, respectively, according to the first embodiment of the present invention.

Incidentally, in FIG. 7, while an example that the stepping sequence in the first measurement is the same as that in the second measurement was explained, as shown in FIG. 8, in sections (a) and (b), a stepping sequence in the second measurement may be differentiated from a stepping sequence in the first measurement. In other words, in FIG. 8(a), the shot areas ESi are successively measured in the same stepping sequence as that shown in FIG. 7(a); whereas, in FIG. 8(b), the shot areas ES16, . . . , ES13, ES12, . . . , ES9, ES8, . . . . ES5, ES4, . . . , ES1 are successively measured in this order. By changing the stepping sequence in the second measurement from the stepping sequence in the first measurement in this way, it is possible to check a difference in stepping accuracy when the stepping sequence is changed. Further, the shot areas ESi may be measured while exposing such shot areas in the first measurement and the shot areas may be measured without performing the exposure in the second measurement so that influence of expansion of the wafer W due to the exposure can be checked. Likewise, influence caused when an auto-levelling operation for correcting inclination of the wafer may be checked by effecting first and second measurements with auto-levelling operation in one measurement and without it in the other measurement.

Figure 9:
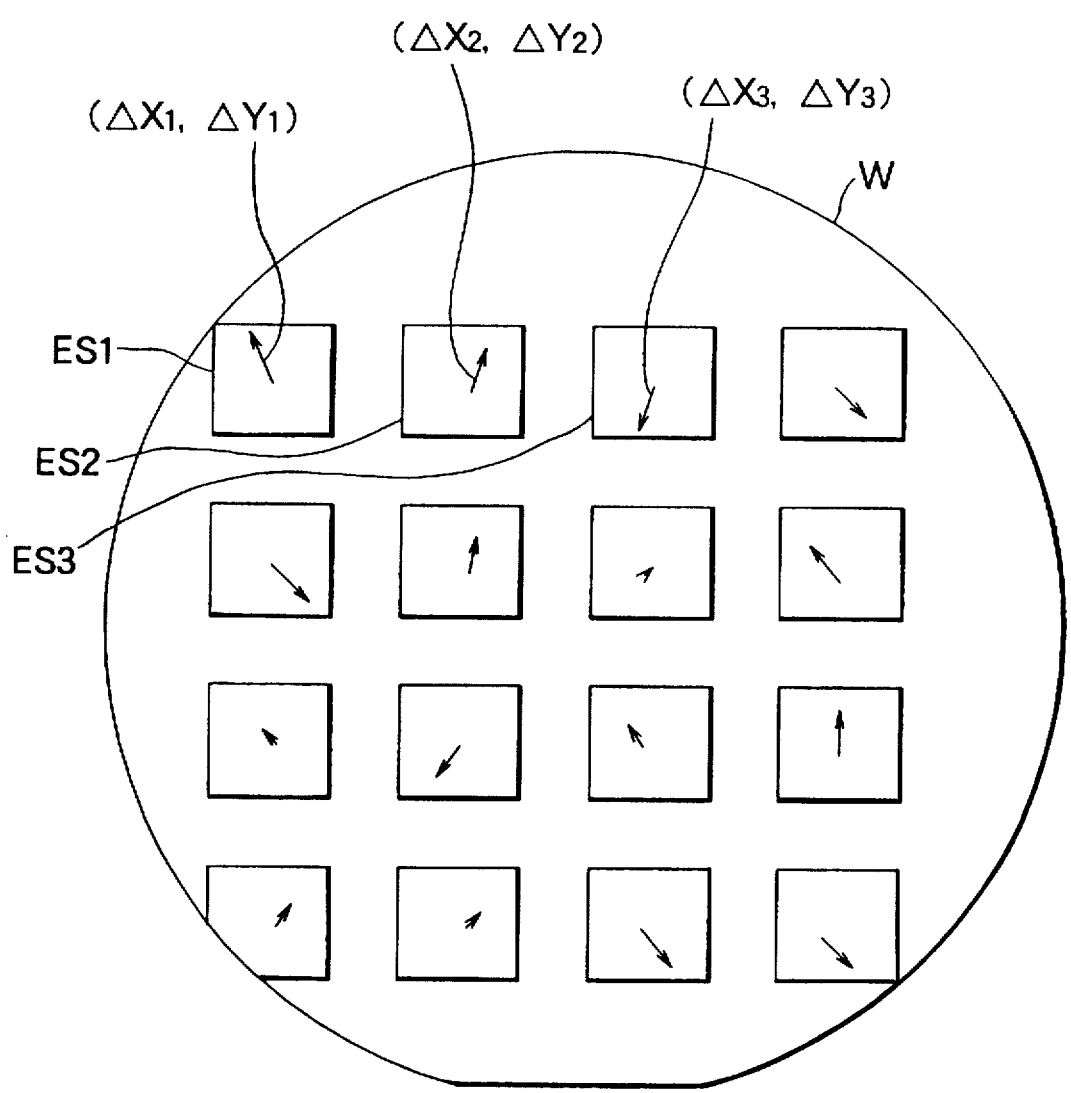
FIG. 9 is a plan view showing an example that a stepping error is indicated by vectors.

Next, several examples of methods for displaying the measured results will be explained. First of all, when the above-mentioned results ①-⑤ are displayed independently, it is desirable to use vector display as shown in FIG. 9. FIG. 9 shows vectors $(\Delta X_1, \Delta Y_1)$, $(\Delta X_2, \Delta Y_2)$, $(\Delta X_3, \Delta Y_3)$, . . . representative of offset amounts obtained by subtracting the coordinate values $(X_{Ai}, Y_{Ai})$ measured in the first measurement from the coordinate values $(X_{Bi}, Y_{Bi})$ measured by the laser interferometer, for instance, in the second measurement, for each of shot areas ES1, ES2, ES3, . . . on the wafer W, in an enlarged scale. Further, when the factors for causing the offset errors can be displayed separately as linear errors and non-linear error, regarding the stepping errors, it is possible to check, at a glance, whether a feature of each low of the shot areas on the wafer W and features of peripheral shot areas on the wafer are good or bad.

Figure 10A:
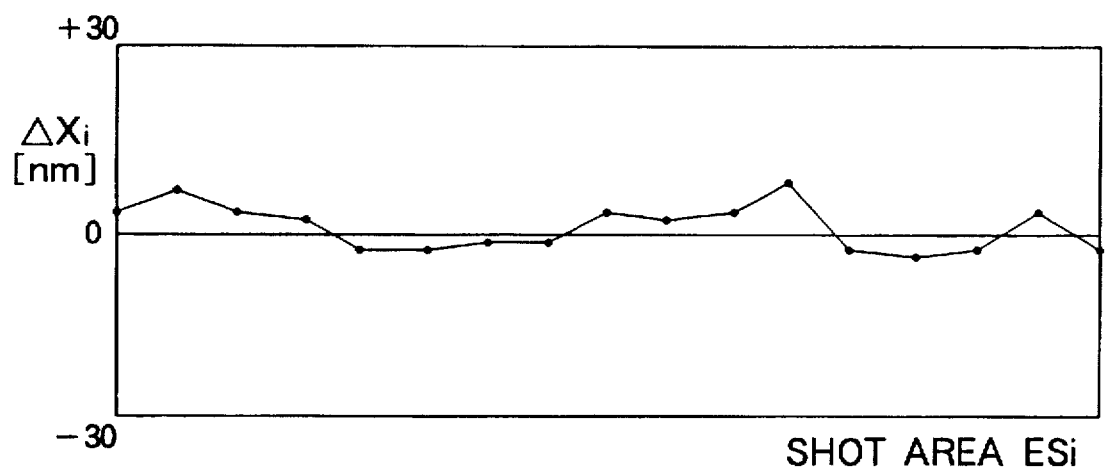
FIG. 10A is a graph showing an offset amount of the stepping error.
Figure 10B:
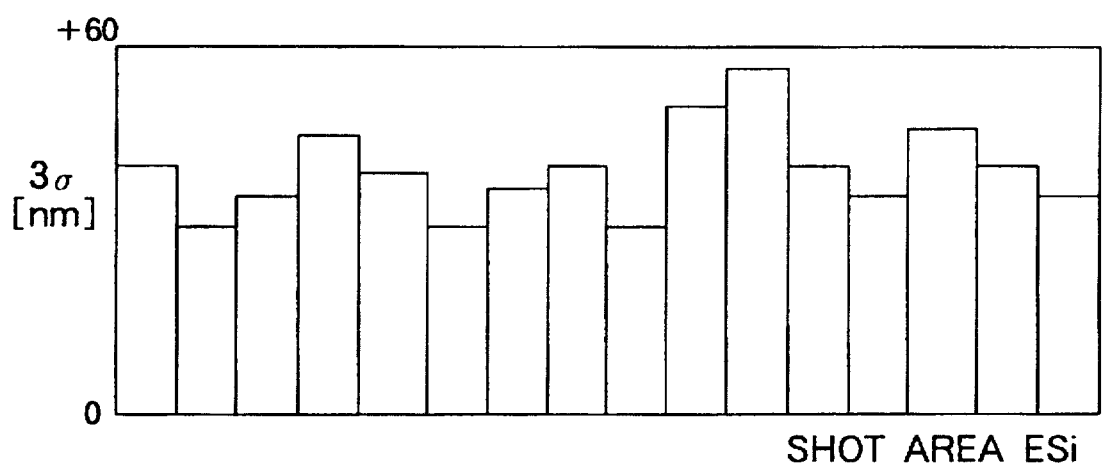
FIG. 10B is a graph showing standard deviation of measured results in an enlarged scale by three times.

Further, the coordinate (X,Y) measured by the laser interferometer and the coordinates (x,y) measured by the LIA system may be displayed as the offset amounts $(\Delta X_i, \Delta Y_i)$, $(\Delta x_i, \Delta y_i)$ for each shot area ESi. Furthermore, it is also possible to make the apparatus to display, in addition to these respective offset amounts, the three-time values ($3\sigma$) of the standard deviations ($\sigma$) obtained by sampling in every 2 msec. FIG. 10A shows X coordinate offset amounts $\Delta X_i$ (among the results measured by the laser interferometer) for shot areas ESi, and FIG. 10B shows the three-time values ($3\sigma$) of the X coordinate sampling values for shot areas ESi. On the basis of the three-time values ($3\sigma$), it is possible to check the degree of vibration generated during the actual exposure, and, it is possible to prevent the deterioration of the projected image by suppressing such a vibration.

Figure 11:
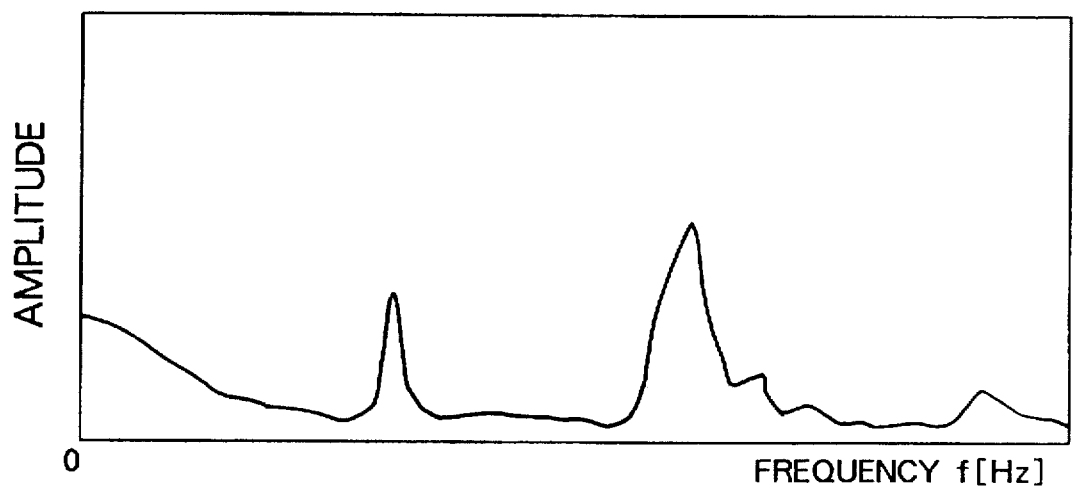
FIG. 11 is a graph showing an example that the measured results are subjected to Fourier transformation.

Further, as shown in FIG. 11, the measured data for the respective shot areas may be subjected to Fourier transformation and the results may be displayed on a graph wherein the abscissa indicates "frequency" and the ordinate indicates "amplitude". In this case, it is possible to correctly determine which portion of the drive system of the exposure apparatus affects the stepping error. In this regard, the measured data for the respective shot areas may be subjected to the Fourier transformation and the result may be averaged to determine average vibration of the exposure apparatus. Further, each of the shot areas may be measured by several times and the measured values may be subjected to the Fourier transformation and then be averaged to check differences in each of all of the shot areas. Incidentally, in the Fourier transformation, particularly when the positions are detected by the LIA system, a new error factor occurs due to the measuring accuracy of the LIA system. However, by performing the measurements by several times and by averaging the Fourier-transformed results, such a new error factor can be made negligible.

Next, a second embodiment of the present invention will be explained with reference to FIG. 12. Also in this embodiment, the projection exposure apparatus shown in FIGS. 1 to 3 is used. Further, the reticle R having the reticle pattern shown in FIG. 5A is used, and the wafer W in which the reticle patterns shown in FIG. 5A were exposed to the respective shot areas ES1–ES16 arranged at a predetermined pitch in X and Y directions as shown in FIG. 6 and which was then developed is used.

Figure 12:
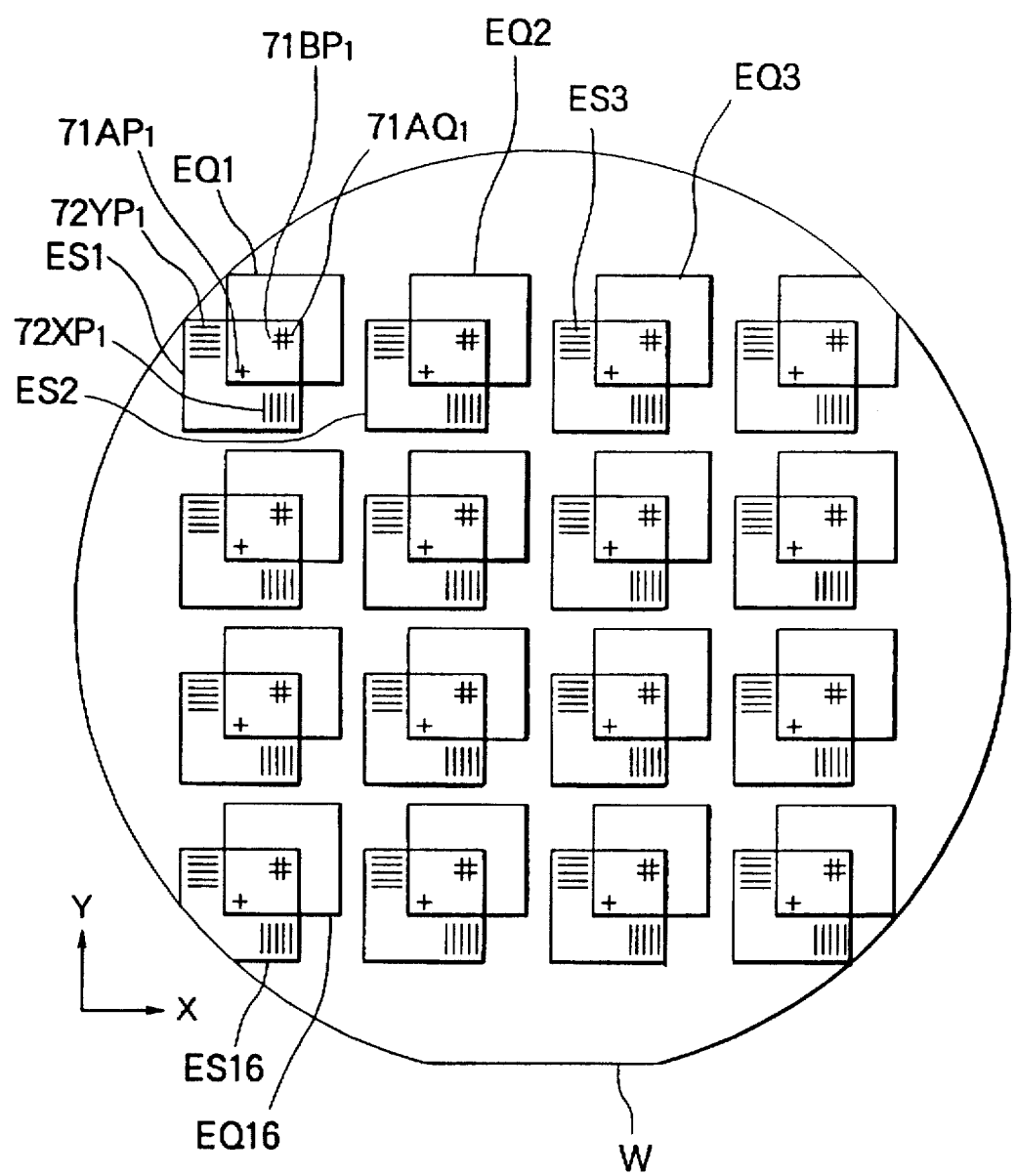
FIG. 12 is a plan view showing arrangement of shot areas obtained by measuring positions of shot areas on a wafer and by exposing such shot areas, according to a second embodiment of the present invention.

FIG. 12 shows the wafer W used in this embodiment. According to this wafer, in an initial condition, the images of the position measuring marks 71A, 71B and the LIA measuring marks 72X, 72Y shown in FIG. 5A are formed on shot areas ES1, ES2, . . . , ES16 as uneven patterns. From this condition, for each of the shot areas ESi (i=1–16), the positions of the LIA measuring marks (72XP$_1$, 72YP$_1$, etc.) in each shot area ESi are detected by using the LIA optical system 45 shown in FIG. 2 in a predetermined sequence (for example, sequence shown in FIG. 7(a)) and at the same time the reticle pattern is exposed. Then, when the wafer is stopped during the exposure, the coordinate values $X_{Ai}$, $Y_{Ai}$, $OF_{Ai}$ measured by the laser beams $LB_X$, $LB_Y$, $LB_{OF}$ of FIG. 4, the positional deviation amounts $x_{Ai}$ of the X-axis LIA measuring mark (72XP, etc), detected by the LIA system, the positional deviation amounts $y_{Ai}$ of the Y-axis LIA measuring mark (72YP$_1$, etc) detected by the LIA system, the room temperature, humidity and air pressure, the correction values of the interferometers (correction values of the wavelengths of the laser beams depending on the temperature and the like) and the torque values of the drive system for the wafer stage WS are sampled.

In this manner, with respect to the shot area ES1, the pattern image of the reticle R is exposed to a shot area EQ1 having the position measuring mark 71BP$_1$ in the center, and an image 71AQ$_1$ of the central measuring mark 71A of FIG. 5A is exposed in the proximity of the position measuring mark 71BP$_1$. Similarly, regarding the remaining shot areas ES2, ES3, . . . , ES16, the pattern images of the reticle R are exposed to shot areas EQ2, EQ3, . . . , EQ16 offset from the shot areas ES2, ES3, . . . , ES16, respectively. Thereafter, by developing the wafer W, the pattern images on the shot areas EQ1–EQ16 are changed to the uneven patterns.

Then, with respect to each of the shot areas EQ1–EQ16, the positions of the LIA measuring marks in each shot area EQi are detected by using the LIA optical system 45 shown in FIG. 2 in a predetermined sequence (for example, sequence shown in FIG. 7(b)). And, the coordinate values $XQ_{Bi}$, $YQ_{Bi}$, $OFQ_{Bi}$ measured by the laser beams $LB_X$, $LB_Y$, $LB_{OF}$ of FIG. 4, the positional deviation amounts $xQ_{Bi}$ of the X-axis LIA measuring mark (72XP$_1$, etc) detected by the LIA system, the positional deviation amounts $yQ_{Bi}$ of the Y-axis LIA measuring mark (72YP$_1$, etc) detected by the LIA system, the room temperature, humidity and air pressure, the correction values of the interferometers (correction values of the wavelengths of the laser beams depending on the temperature and the like) and the torque values of the drive system for the wafer stage WS are sampled.

Thereafter, by analyzing the measured results obtained in the above-mentioned two measurements, the factors for causing the stepping error are determined. In this case, for example, the difference between the first measurement and the second measurement is determined in the same manner as the first embodiment, thereby grouping or sorting the stepping error into error factors. Further, in this embodiment, since the results obtained in the two measurements are obtained by actual exposure, by comparing the stepping error obtained in this second embodiment with the stepping error obtained by the method used in the first embodiment, it is possible to guess the presence of errors (for example, torsion of the exposure apparatus, drift of the reticle R or the like) other than the stepping error obtained by the method used in the first embodiment. Further, the method according to the second embodiment may be used to check the condition of the stepping accuracy not only during the adjustment of the exposure apparatus but also during the maintenance in the site.

Incidentally, in the above-mentioned embodiments, while the TTL system alignment sensor 17 is used to detect the positions of the shot areas, an alignment sensor not directly associated with the projection optical system 13 (such as the alignment system (20-34) of off-axis type shown in FIG. 1) may be used to detect the positions of the shot areas. In this case, although the measured positions differs from the actual exposure positions more or less, the similar stepping error can be detected. Further, even when the alignment system of off-axis type is used, by measuring the coordinates by using the laser beams $LB_Y$, $LB_{OF}$ as shown in FIG. 4, it is possible to suppress the occurrence of the Abbe error. Alternatively, an alignment system of TTL (through the lens) type capable of measuring the reticle R and the wafer W may simultaneously be used to detect the positions of the shot areas.

Further, in the above-mentioned embodiments, while the present invention is applied to the projection exposure apparatus (stepper and the like) of step-and-repeat type, the present invention may be applied to an exposure apparatus of a so-called step-and-scan type wherein each of shot areas is exposed by scanning a reticle and a wafer by a slit-shaped illumination area. In this case, by utilizing a laser interferometer for monitoring a relative position between the reticle and the wafer, an LIA system alignment system of homodyne type capable of continuously monitoring positions in a scanning direction of the wafer, and an LIA system alignment system of heterodyne type capable of continuously monitoring positions in a non-scanning direction perpendicular to the scanning direction, the stepping error can be measured as in the aforementioned embodiments.

Further, in the above-mentioned embodiments, while an example that the position of each mark is detected after the wafer W is developed is explained, the position of each mark may be detected when the mark is in a latent image condition after the exposure and before the development. In this way, the present invention is not limited to the aforementioned embodiments, and various alterations and modifications can be made within the scope of the present invention.

According to the stepping accuracy measuring method in accordance with the first embodiment of the present invention, since the measured results obtained in the first measurement can be compared with the measured results obtained in the second measurement without actual exposure, the measuring efficiency for measuring the stepping accuracy of the wafer stage can be enhanced. Further, since the measured results obtained from the coordinate measuring means and the measured results obtained from the alignment system are stored independently, the factors for causing the stepping accuracy can be analyzed. Accordingly, particularly when the stepping accuracy measuring method according to the first embodiment is used during the adjustment of the exposure apparatus, since the factors for causing the stepping error can be specified or identified, it is possible to reduce the adjusting time for the exposure apparatus.

Further, according to the stepping accuracy measuring method in accordance with the second embodiment of the present invention, since the measurement is performed while the exposure is being affected, the measuring efficiency for measuring the stepping accuracy of the wafer stage can be improved. Further, since the measured results obtained from the coordinate measuring means and the measured results obtained from the alignment system are stored independently, the factors for causing the stepping accuracy can be analyzed. In addition, since the actual exposed results are used, the factors for causing the deterioration of exposed images can also be analyzed.

Next, a third embodiment of the present invention will be explained with reference to FIGS. 13 to 33. In this third embodiment, the same elements as those in the embodiments shown in FIGS. 1 to 12 are designated by the same reference numerals and detailed explanation thereof will be omitted.

Figure 13:
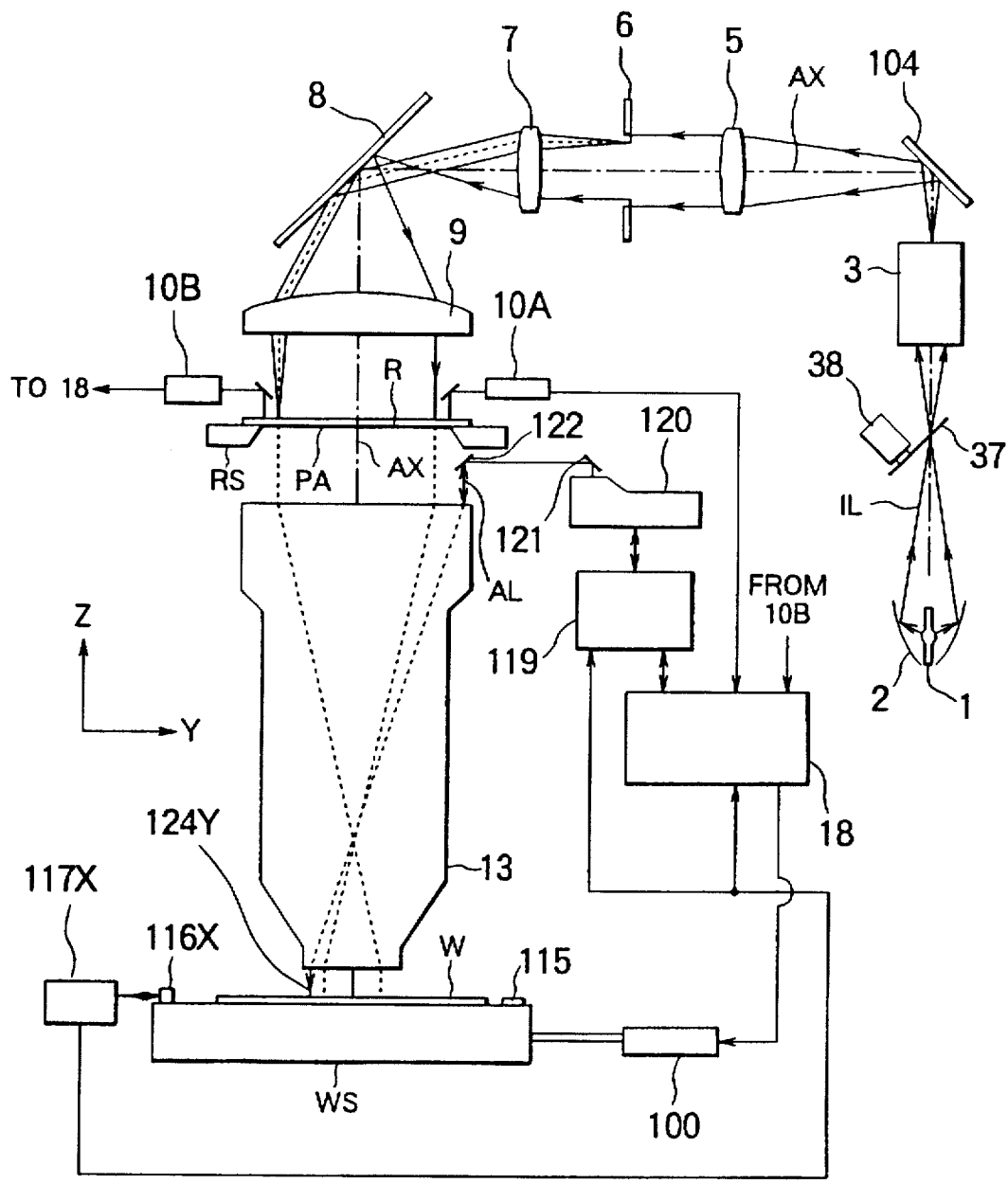
FIG. 13 is a schematic illustration of a projection exposure apparatus to which a third embodiment of the present invention is applied.

FIG. 13 schematically shows a projection exposure apparatus to which a stepping accuracy measuring method according to the third embodiment is suitably applied. In FIG. 13, a light path through which illumination light emitted from a super-high pressure mercury lamp 1 reaches a projection optical system 13 is substantially the same as the light path shown in FIG. 1 except that the beam splitter 4 is replaced by a mirror 104.

Figure 15A:
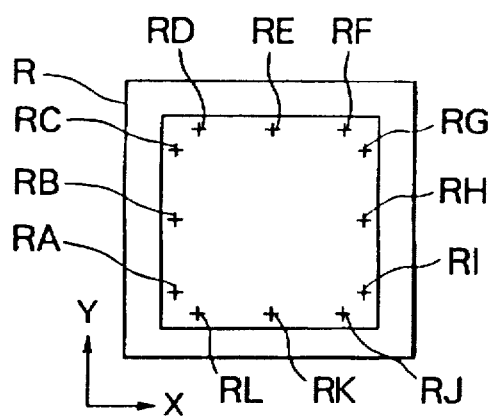
FIG. 15A is a plan view showing patterns of a reticle R of the apparatus of FIG. 13.
Figure 15B:
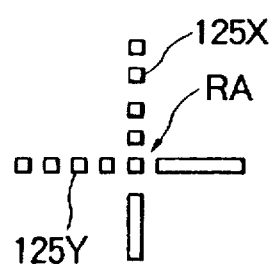
FIG. 15B is an enlarged view showing an evaluation mark RA in FIG. 15A.

FIG. 15A shows a pattern on a reticle R used in this embodiment. In FIG. 15A, identical evaluation marks RA, RB, ..., RL are formed on a peripheral portion of a pattern area of the reticle R. Further, the evaluation marks RA-RC are arranged symmetrically with the evaluation marks RG-RI with respect to an optical axis of the projection optical system 13, and the evaluation marks RD-RF are arranged symmetrically with the evaluation marks RJ-RL with respect to the optical axis of the projection optical system 13. For example, as shown in FIG. 15B, the evaluation mark RA is constituted by a dot pattern array 125Y comprised of a plurality of dots arranged at a predetermined pitch along an X direction and a dot pattern array 125X comprised of a plurality of dots arranged at a predetermined pitch along a Y direction. The evaluation mark RA may be formed on a light shielding film as an aperture pattern. The evaluation mark RA may also be formed from light shielding films disposed on a light permeable element. In this case, however, a mark portion obtained in the second exposure must be shielded. Further, reticle alignment marks (not shown) consisting of two criss-cross light shielding marks are formed on an outer peripheral portion of the reticle R in an opposed relation.

Returning to FIG. 13, such two alignment marks are used to effect the alignment of the reticle R (with respect to the optical axis AX of the projection optical system 13). The reticle R can be shifted by fine movement along the optical axis AX of the projection optical system 13 and is rested on a reticle stage RS which can be two-dimensionally shifted and finely rotated in a plane perpendicular to the optical axis AX. Reticle alignment systems (RA systems) 10A, 10B are arranged above the reticle R. These RA systems 10A, 10B serve to detect the two criss-cross alignment marks formed on the outer peripheral portion of the reticle R. By finely shifting the reticle stage RS on the basis of measured signals from the RA systems 10A, 10B, the reticle R is positioned so that the center of the pattern area PA of the reticle is aligned with the optical axis AX of the projection optical system 13.

On the other hand, a wafer W is vacuum-sucked to a wafer holder (not shown) which can be shifted by fine movement and is held by a wafer stage WS via the wafer holder. The wafer stage WS can be shifted two-dimensionally in a step-and-repeat process by means of a drive device 100 so that, when image-transfer and exposure of the reticle R regarding one of shot areas on the wafer W are finished, the wafer stage WS can be shifted steppingly to a next shot area.

Figure 14:
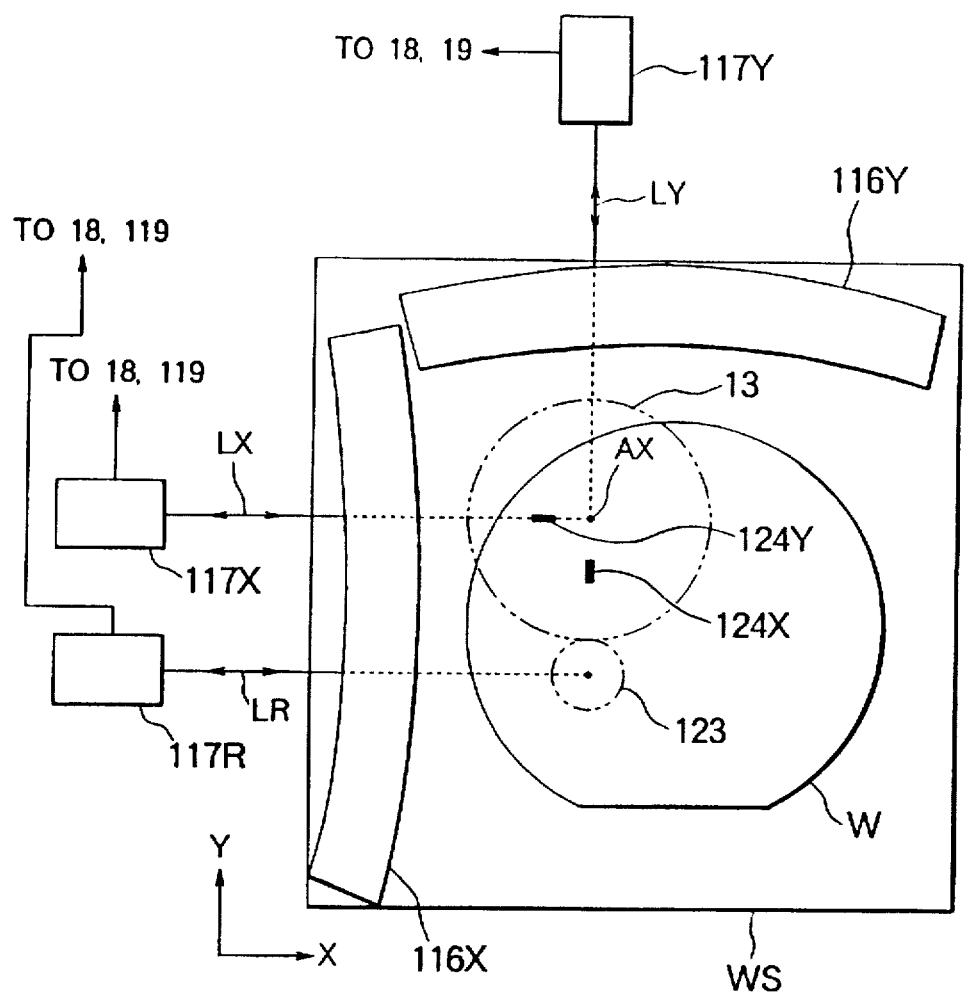
FIG. 14 is a plan view showing a wafer stage WS of the apparatus of FIG. 13.

FIG. 14 shows a coordinate measuring mechanism for the wafer stage WS. In FIG. 14, an X-axis movable mirror 116X and a Y-axis movable mirror 116Y are secured to the wafer stage WS. An X-axis laser interferometer 117X is fixedly mounted in an opposed relation to the movable mirror 116X and a Y-axis interferometer 117Y is fixedly mounted in an opposed relation to the movable mirror 116Y. Optical axes of the laser interferometers 117X, 117Y extend across the optical axis AX of the projection optical system 13 and an optical axis of a laser interferometer 117R extends across an optical axis of an alignment sensor 123 of off-axis type (not shown in FIG. 13) arranged at a side of the projection optical system 13. Further, laser beams LX, LR from the laser interferometers 117X, 117R are reflected by the movable mirror 116X and a laser beam LY from the laser interferometer 117Y is reflected by the movable mirror 116Y so that coordinate values measured by the laser interferometers 117X, 117R, 117Y are supplied to a main control system 18 and an alignment control system 119 of FIG. 13.

An X coordinate value of the wafer stage WS is determined by the laser interferometer 117X and a Y co-ordinate value of the wafer stage WS is determined by laser interferometer 117Y. These measured results are always detected with a resolving power of about 0.01 µm, for instance. A stage coordinate system (stationary co-ordinate system) (X,Y) of the wafer stage WS is determined by the measured coordinates in the X and Y direction.

Further, a reference member (glass substrate) 115 having reference marks used in the measurement of a baseline amount (deviation amount between a reference position of the alignment system and a reference position of the exposure) is provided on the wafer stage WS in such a manner that it is substantially flush with an exposure plane of the wafer W.

Further, an X-axis TTL (through the lens) system alignment system 120 of laser-step-alignment type (referred to as "LSA system" hereinafter) is arranged at a side of an upper portion of the projection optical system 13 so that a position detecting laser beam AL emitted from the alignment system 120 is directed to the projection optical system through mirrors 121, 122. As shown in FIG. 14, the laser beam AL is directed onto the wafer W in the proximity of the image of the evaluation mark to be measured, as a slit-shaped spot light 124X elongated in the Y direction. Returning to FIG. 13, when the evaluation mark image is scanned in the X direction by the spot light 124X by using the wafer stage WS, as the evaluation mark image passes across the spot light 124X, diffraction light from the evaluation mark image is returned to the alignment system 120 through the projection optical system 13 and the mirrors 122, 121. A detection signal photoelectrically converted by the LSA system alignment system 120 is supplied to the alignment control system 119. The details of such an LSA system alignment system is disclosed in U.S. Pat. No. 5,151,750.

The coordinate values (X,Y) of the wafer stage WS measured by the laser interferometers 117X, 117Y, 117R are also supplied to the alignment control system 119. In the alignment control system 119, for example, the X co-ordinate value of the wafer stage WS obtained when the detection signal emitted from the alignment system 120 has a peak value is detected as an X coordinate value of the evaluation mark image to be measured, and the detected X coordinate value of the evaluation mark image is supplied to the main control system 18. In this case, according to the illustrated embodiment, the X coordinate is determined on the basis of the measured value obtained from the laser interferometer 117X. In this case, since the spot light 124X is spaced apart from the optical axis of the laser interferometer 117X, an Abbe error will occur. In this embodiment, the Abbe error is corrected by calculating a difference between the measured results obtained by the laser interferometers 117X and 117R.

Similarly, as shown in FIG. 14, there is also arranged a Y-axis alignment system of LSA type capable of directing a laser beam onto the wafer in an exposure field of the projection optical system 13 as a slit-shaped spot light 124Y elongated in the X direction. The evaluation mark image is scanned with respect to the spot light 124Y, and diffraction light from the evaluation mark image is received by the Y-axis alignment system. A detection signal emitted from the Y-axis alignment system is also supplied to the alignment control system 119 of FIG. 13. The alignment control system 119 serves to determine the Y coordinate value of the evaluation mark image on the basis of the detection signal and to output a result to the main control system 18. Regarding the Y-axis, since the spot light 124Y is spaced apart from the optical axis of the laser interferometer 117Y, the Abbe error is corrected by using a similar method.

In the main control system 18, the coordinate values of the evaluation mark images supplied from the alignment control system 119 are calculated in a manner which will be described later, thereby evaluating the stepping accuracy of the wafer stage WS. Incidentally, the coordinate values of the evaluation mark images may be calculated by other process device.

Next, an example of an evaluation method for evaluating the stepping accuracy according to this embodiment will be explained. A reticle R on which a plurality of evaluation marks are formed as shown in FIGS. 15A and 15B are used.

Figure 16A:
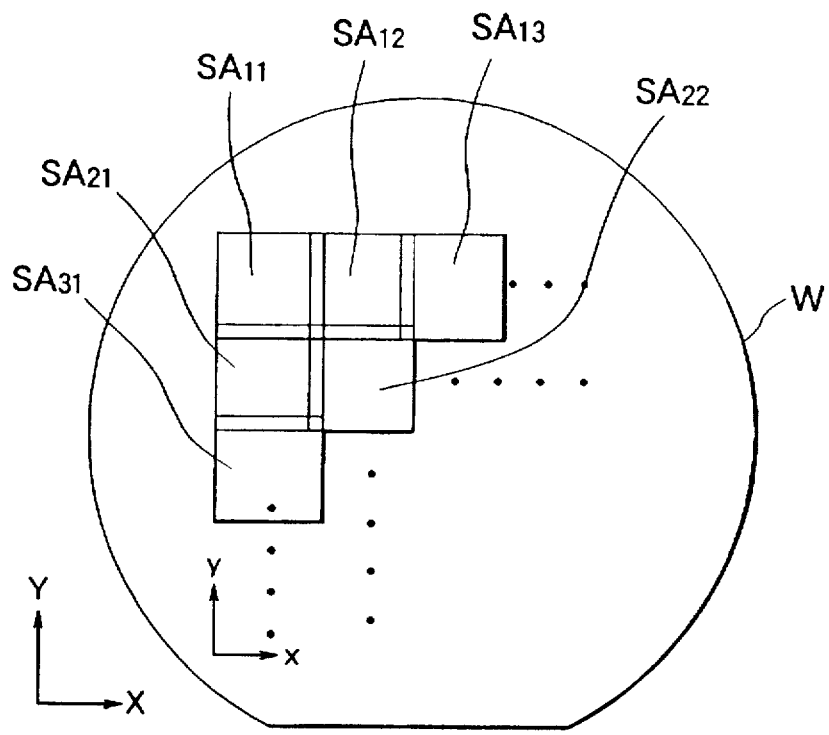
FIG. 16A is a plan view showing arrangement of shot areas on a wafer W to be exposed.

First of all, by driving the wafer stage WS of FIG. 13 steppingly, as shown in FIG. 16A, the pattern of the reticle R is successively exposed to shot areas $SA_{11}$, $SA_{12}$, etc. arranged on the wafer W along the X direction to define a first row. In this case, the shot areas $SA_{11}$, $SA_{12}$, etc. are arranged so that ends of the shot areas are overlapped with each other by a predetermined amount in the X direction, respectively. Then, the pattern of the reticle R is successively exposed to shot areas $SA_{21}$, $SA_{22}$, etc. arranged on the wafer W along the X direction to define a second row. In this case, the shot areas $SA_{21}$, $SA_{22}$, etc. are arranged so that ends of the shot areas are overlapped with each other by a predetermined amount in the X direction, respectively, and the shot areas in the first row are also overlapped with the shot areas in the second row by a predetermined amount in the Y direction. Similarly, regarding the shot areas in a third row, a fourth row and so on, by driving the wafer stage WS steppingly so that ends of the shot areas are overlapped with the shot areas in the next row in the X and Y directions, respectively, the pattern of the reticle R is successively exposed to shot areas in each row.

After the pattern of the reticle is exposed to all of the shot areas on the wafer W, the photoresist on the wafer W is developed to form the exposed evaluation mark images on the wafer as uneven patterns. Thereafter, the wafer W is rested on the wafer stage WS of FIG. 13 again, and then the coordinates of the evaluation mark images in the stage coordinate system (X,Y) are measured by using the X-axis alignment system 120 and the Y-axis alignment system of the LSA system. In this case, the evaluation mark images to be measured are arranged as shown in FIG. 16B.

Figure 16B:
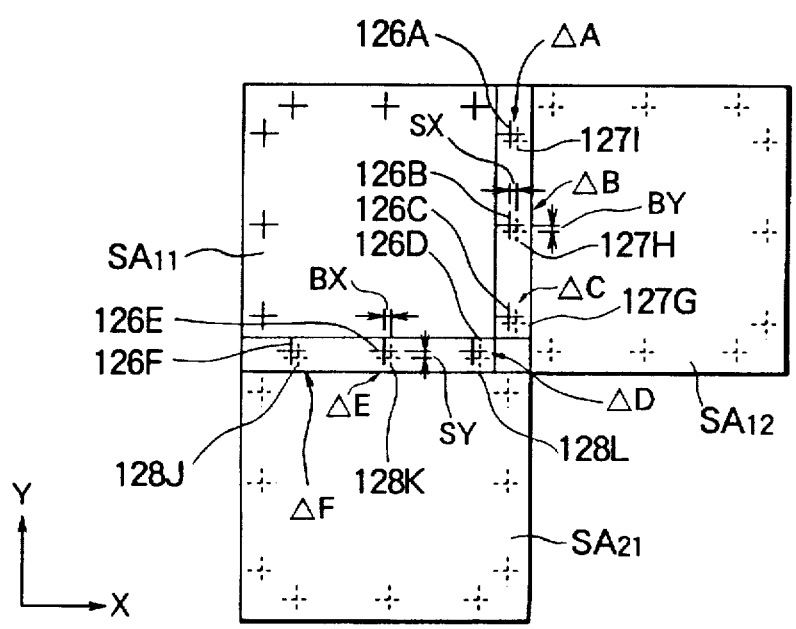
FIG. 16B is an enlarged plan view showing several shot areas.

FIG. 16B is an enlarged view showing the shot area $SA_{11}$ of FIG. 16A and therearound. In FIG. 16B, evaluation mark images 126A–126C formed by exposing the shot area $SA_{11}$ and evaluation mark images 127I–127G formed by exposing the shot area $SA_{12}$ are included in an overlapped zone between the shot area $SA_{11}$ and the shot area $SA_{12}$ in the X direction in an adjacent relation. The evaluation mark images 126A–126C are images of the evaluation marks RA–RC shown in FIG. 15A and the evaluation mark images 127I–127G are images of the evaluation marks RI–RG shown in FIG. 15A. In this case, deviation amounts (alignment errors) $\Delta A$, $\Delta B$, $\Delta C$ from a predetermined reference distance between the evaluation mark images 126A, 126B, 126C and the evaluation mark images 127I, 127H, 127G are measured by the LSA system alignment system. Each of the alignment errors $\Delta A$–$\Delta C$ is comprised of a deviation amount in the X direction and a deviation amount in the Y direction. A deviation amount between the central evaluation mark images 126B and 127H in the X direction is called as SX (step X) and a deviation amount in the Y direction is called as BY (back Y).

Figure 17:
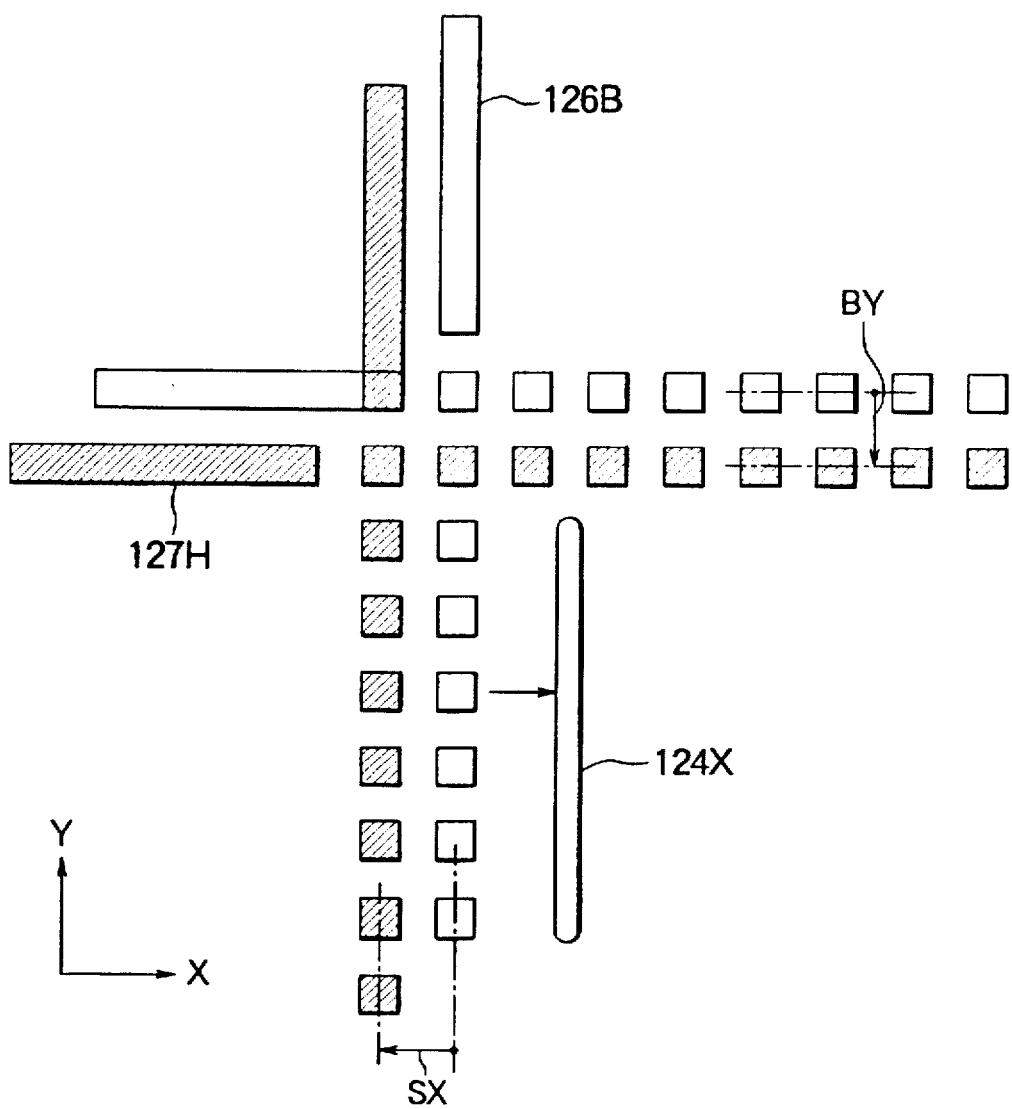
FIG. 17 is an enlarged plan view showing a relation between a measuring laser beam and an evaluation mark image when a position of the evaluation mark image is measured by a vernier evaluation method.

More specifically, in order to measure the deviation amount SX between the evaluation mark images 126B and 127H, as shown in FIG. 17, the laser beam emitted from the X-axis alignment system is directed onto a point in the proximity of the evaluation mark images 126B, 127H as the slit-shaped spot light 124X. Then, in driving the wafer stage WS to scan the evaluation mark images 126B, 127H with respect to the spot light 124X along the X direction, as the spot light 124X is aligned with the evaluation mark images 126B, 127H, diffraction light beams emitting in predetermined directions are generated. Thus, the X coordinate values of the evaluation mark images 126B, 127H can be detected on the basis of the diffraction light beams, and a deviation amount of a difference between the X coordinate values from a predetermined reference distance (in FIG. 17, the reference distance is set to zero) is regarded as the deviation amount SX. Similarly, the deviation amount BY between the evaluation mark images 126B and 127H in the Y direction is also detected.

The deviation amount (step X) SX does not include the Abbe error. On the other hand, the deviation amount BY includes an error caused by the yawing of the wafer stage WS. An error obtained by subtracting the yawing error from the deviation amount BY is defined as "stepping error" in a narrow sense.

Returning to FIG. 16B, evaluation mark images 126D–126F formed by exposing the shot area $SA_{11}$ and evaluation mark images 128L–128J formed by exposing the shot area $SA_{21}$ are included in an overlapped zone between the shot area $SA_{11}$ and the shot area $SA_{21}$ in the Y direction in an adjacent relation. The evaluation mark images 126D–126F are images of the evaluation marks RD–RF shown in FIG. 15A and the evaluation mark images 128L–128J are images of the evaluation marks RL–RJ shown in FIG. 15A. Also in this case, deviation amounts (alignment errors) $\Delta D$, $\Delta E$, $\Delta F$ from a predetermined reference distance between the evaluation mark images 126D, 126E, 126F and the evaluation mark images 128L, 128K, 128J are measured by the LSA system alignment system. A deviation amount between the central evaluation mark images 126E and 128K in the Y direction is called as SY (step Y) and a deviation amount in the X direction is called as BX (back X). The deviation amount SY does not include the Abbe error.

In this way, in the overlapped zones between all of the shot areas on the wafer W shown in FIG. 16A, the deviation amounts (alignment errors) of the evaluation mark images (formed adjacent to each other) from the reference distances are measured. By doing so, regarding the respective shot areas, the deviation amounts corresponding to the alignment errors $\Delta A$–$\Delta F$ are measured, and the measured alignment errors are stored in a data file of the memory portion of the apparatus. On the basis of such alignment errors, errors regarding factors for lowering the stepping accuracy are determined in the following manner.

Figure 18:
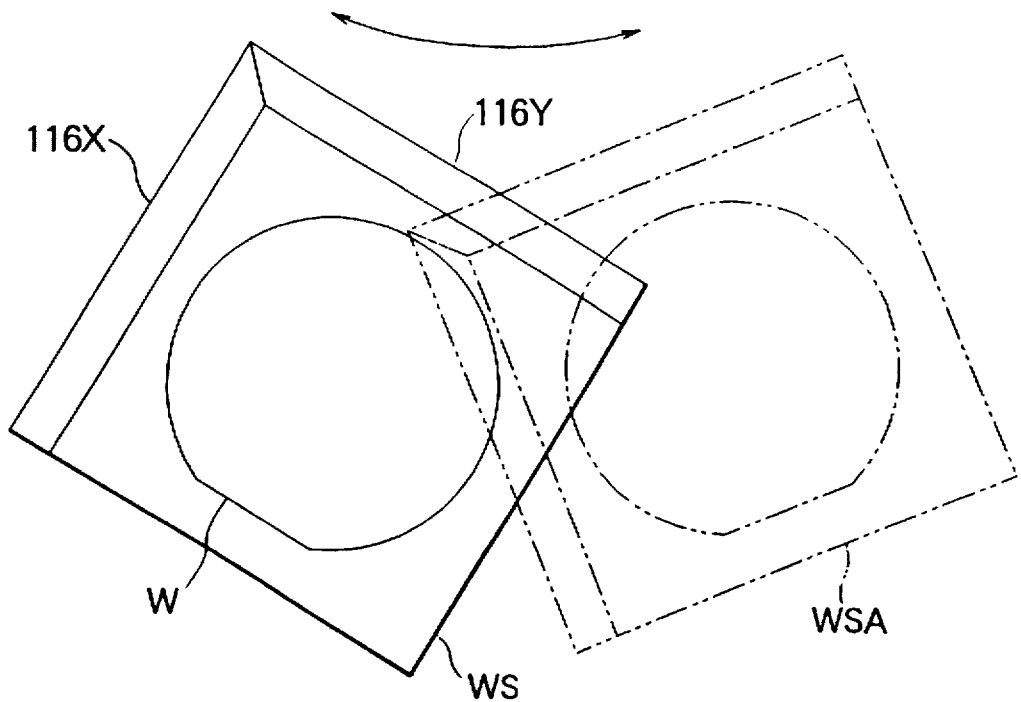
FIG. 18 is a view showing a condition that yawing is generated when the wafer stage WS is shifted.

First of all, one of the factors for lowering the stepping accuracy is the yawing of the wafer stage WS. In general, when the wafer stage WS is shifted, as shown in FIG. 18, yawing occurs. Yawing means a situation in which a rotational condition of the wafer stage WS in the shifted position WSA changes. If such yawing occurs, in FIG. 16B, the deviation amounts BX (back X) and BY (back Y) will include errors due to the rotation of the wafer.

Figure 19:
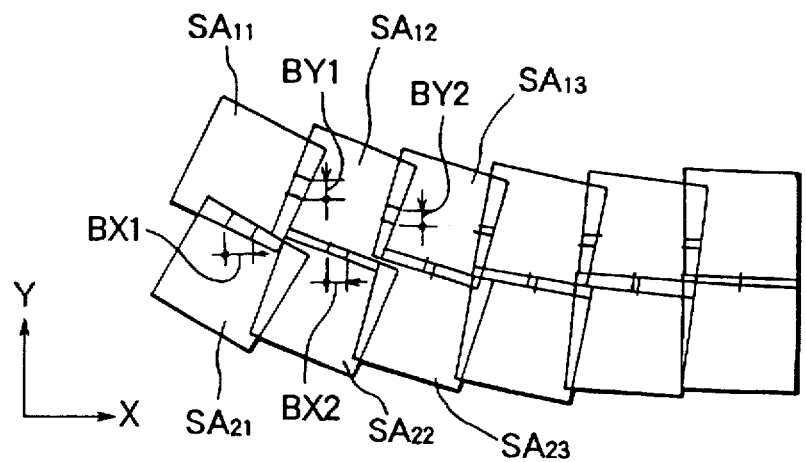
FIG. 19 is a view showing change in the shot arrangement on the wafer when the yawing is generated.

For example, as shown in FIG. 19, when the arrangements of the shot areas $SA_{11}$, $SA_{12}$, ... and the shot areas $SA_{21}$, $SA_{22}$, ... are changed because of the yawing of the wafer stage WS, the deviation amounts BY1, BY2, ... between the shot areas in the first row along the Y direction and the deviation amounts BX1, BX2, ... between the shot areas in the first row and the shot areas in the second row along the X direction are changed depending on the position of the wafer stage.

Figure 20:
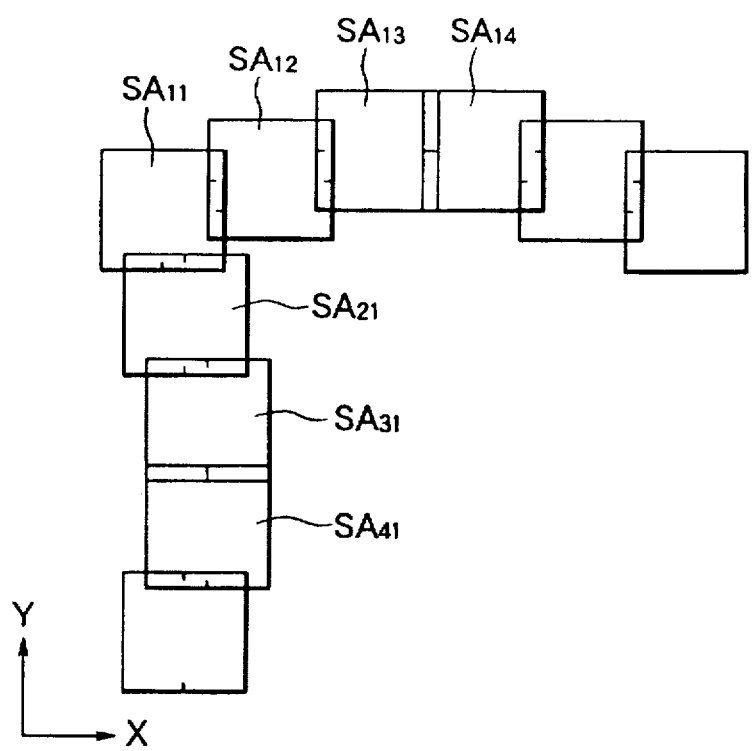
FIG. 20 is a view showing change in the shot arrangement on the wafer when a movable mirror is distorted.

Further, another factor for lowering the stepping accuracy is caused by distortion of the movable mirrors 116X, 116Y shown in FIG. 14. If the movable mirrors 116X, 116Y themselves are distorted, even when the wafer stage WS is linearly shifted step by step in the Y direction or the Y direction on the basis of the coordinate values measured by the laser interferometers 117X, 117Y, as shown in FIG. 20, the shot areas $SA_{11}$, $SA_{12}$, ... arranged along the X direction are deviated in the Y direction and the shot areas $SA_{11}$, $SA_{21}$, ... arranged along the Y direction are deviated in the X direction. That is to say, the actual shifting trace of the wafer stage WS is curved, with the result that the deviation amounts BY (back Y) between the shot areas in the same row along the Y direction and the deviation amounts BX (back X) between the shot areas in a certain row and the shot areas in the adjacent row along the X direction are changed depending on the position of he wafer stage. Accordingly, if the movable mirrors 116X, 16Y are distorted, the stepping accuracy will be lowered.

Now, a method for determining the error caused by the yawing of the wafer stage WS and the error caused by the distortion of the movable mirrors 116X, 116Y on the basis of the deviation amounts (alignment errors) $\Delta B$ (SX,BY) and $\Delta E$ (BX,SY) measured regarding the respective shot areas as shown in FIG. 16B will be explained. To this end, it is assumed that the measured deviation amount (SX,BY) in the overlapped zone between n-th shot area (n=1, 2, ...) and a shot area adjacent thereto is ($ASB_{Xn}$, $ASB_{Yn}$) and the deviation amount (BX,SY) is ($ABS_{Xn}$, $ABS_{Yn}$).

Further, it is assumed that a sample coordinate system on the wafer W is (x,y) and designed (when exposed) coordinate values of the center of the n-th shot area in the sample coordinate system (x,y) are ($D_{xn}$, $D_{yn}$) In this case, after the development, when the wafer W is rested on the wafer stage WS and the values of the center of the shot area are measured, the values of the center are deviated from the designed values ($D_{xn}$, $D_{yn}$) by a linear error comprised of scaling values Rx, Ry, degree of perpendicularity $\omega$, rotation $\theta$ and offset amounts Ox, Oy, and the other non-linear error.

The scaling values Rx, Ry indicate degrees of positional deviation due to linear expansion or contraction in the X and Y directions of the wafer W, the degree of perpendicularity ω indicates the fact that an angle of the X axis is deviated from (Y axis+90°) by ω |rad|, and the rotation θ indicates an angle |rad| between the sample system (x, y) and the stage system (X,Y).

In the case where (SX,BY), i.e., ($ASB_{Xn}$,$ASB_{Yn}$) is used as the deviation amount, since the measured coordinate value of the n-th shot area becomes ($D_{xn}$+$ASB_{Xn}$, $D_{yn}$+$ASB_{yn}$), when the non-linear error is ($\epsilon ASB_{xn}$,$\epsilon ASB_{yn}$), the non-linear error can be represented as follows:

$$\begin{bmatrix} \epsilon ASB_{xn} \\ \epsilon ASB_{yn} \end{bmatrix} = \begin{bmatrix} D_{xn} + ASB_{Xn} \\ D_{yn} + ASB_{Xn} \end{bmatrix} - \quad (3)$$

$$\begin{bmatrix} Rx & -Rx(\omega + \theta) \\ Ry \cdot \theta & Ry \end{bmatrix} \begin{bmatrix} D_{xn} \\ D_{yn} \end{bmatrix} \begin{bmatrix} Ox \\ Oy \end{bmatrix}$$

In the illustrated embodiment, values of the six parameters (Rx,Ry,ω,θ,Ox,Oy) in the above equation (3) are determined by the method of least squares. To do so, sum of squares the non-linear errors ($\epsilon ASB_{xn}$,$\epsilon ASB_{yn}$) of all of the measured shot areas represented by the above equation (3) are totalized to define the following residual error component, and the above six parameters may be determined to minimize the residual error component:

$$\text{residual error component} = \sum_{n=1}^{N} (\epsilon ASB_{xn}^2 + \epsilon ASB_{yn}^2) \quad (4)$$

In this way, linear and non-linear error components an be determined from the alignment errors (SX,BY) of the hot areas.

Similarly, in the case where (BX,SY), i.e., ($ABS_{Xn}$, $ABS_{Yn}$) is used as the deviation amount, since the measured coordinate value of the n-th shot area becomes ($D_{xn}$+$ABS_{Xn}$, $D_{yn}$+$ABS_{Yn}$), when the non-linear error is ($\epsilon ABS_{xn}$, $\epsilon ABS_{yn}$), the non-linear error can be represented as follows. Incidentally, in this case, in order to distinguish it from the above equation (3), the six parameters are indicated as Rx', Ry', ω', θ', Ox' and Oy':

$$\begin{bmatrix} \epsilon ABS_{xn} \\ \epsilon ABS_{yn} \end{bmatrix} = \begin{bmatrix} D_{xn} + ABS_{Xn} \\ D_{yn} + ABS_{Xn} \end{bmatrix} - \quad (5)$$

$$\begin{bmatrix} Rx' & -Rx'(\omega' + \theta') \\ Ry' \cdot \theta & Ry' \end{bmatrix} \begin{bmatrix} D_{xn} \\ D_{yn} \end{bmatrix} \begin{bmatrix} Ox' \\ Oy' \end{bmatrix}$$

Also in this case, values of the six parameters (Rx',Ry', ω',θ',Ox',Oy') are determined by the method of least squares. To do so, the six parameters may be determined to minimize the following residual error component:

$$\text{residual error component} = \sum_{n=1}^{N} (\epsilon ABS_{xn}^2 + \epsilon ABS_{yn}^2) \quad (6)$$

In this way, when (BX,SY) is used as the alignment error, components of the linear error and non-linear error can be determined.

Then, if the yawing of the wafer stage WS occurs, simulation is effected to check tendency of the change of the linear and non-linear error components.

Figure 21:
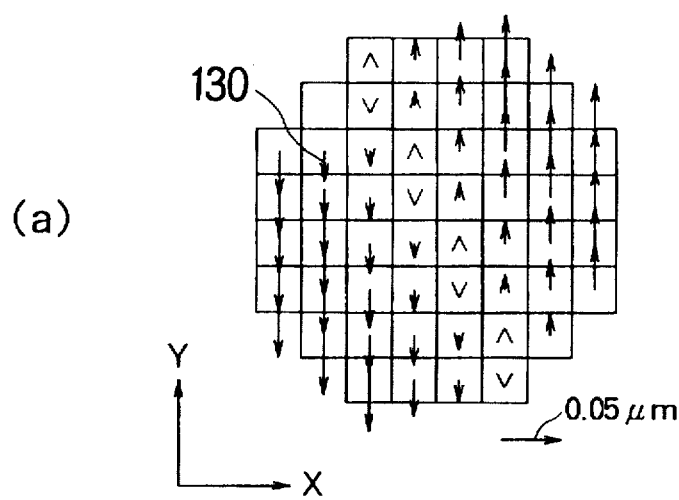
FIG. 21 shows a simulation result of an alignment error (SX.BY) when the yawing is generated.
Figure 22:
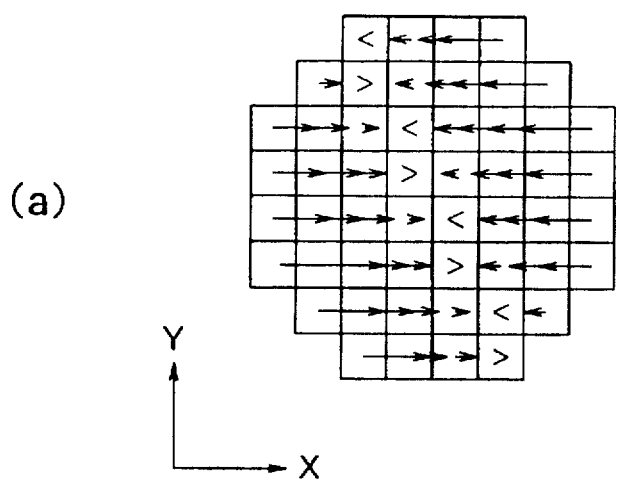
FIG. 22 shows a simulation result of an alignment error (BX.SY) when the yawing is generated.

FIGS. 21 and 22 show simulation results obtained when rotation (yawing) as shown in FIG. 18 is applied to the wafer stage WS so that the error in the degree of perpendicularity has −1μ |rad| between shot areas and 0.5μ |rad| in the X direction. FIG. 21 shows a result obtained when (SX,BY) is used as the alignment error, and FIG. 22 shows a result obtained when (BX,SY) is used as the alignment error. For example, FIG. 21(a) shows vectors (BX,SY) of alignment error in the respective shot areas on the wafer W, in which a vector 130 indicates the vector of alignment error in the associated shot area. Further, FIG. 21(b) shows average values of the alignment errors SX (step X), BY (back Y), three-time values (3σ) of standard deviations (σ) and errors (deviation from 1) of the scaling values Rx, Ry, degrees of perpendicularity ω and rotation values θ which represent linear errors. Further, FIG. 21(c) shows three-time values (3σ) of the standard deviations of the linear errors in the X and Y directions regarding the shot areas (determined by the parameters Rx, Ry, ω and θ and offset amounts Ox, Oy), and FIG. 21(d) shows three-time values (3σ) of the standard deviations of non-linear error components in the X and Y directions determined from the above equation (3). FIGS. 22(b) to 22(d) show values similar to those shown in FIGS. 21(b) to 21(d).

Now, referring to the scaling values Rx, Ry, it is found that the scaling error in represented by the scaling value Ry in FIG. 21(b) and the scaling value (error) Rx in FIG. 22(b), and that the scaling value Ry in FIG. 21(b) is the same as the degree of perpendicularity ω in FIG. 22(b). Further, it is found that the scaling value (error) Rx in FIG. 22(b) is the same as the degree of perpendicularity ω in FIG. 21(b) and has the same value as the rotation θ in FIG. 21(b) but has the inverse sign (minus sign). Thus, when the shot areas are rotated by the same deviation amounts, the error value caused by the yawing can be determined on the basis of the scaling values Rx, Ry, degree of perpendicularity ω and rotation θ. For example, ½ of the scaling value Ry (0.5) in FIG. 21(b), i.e., 0.25μ |rad| is an error caused by the yawing at the outer most peripheral portion of the wafer.

Figure 23:
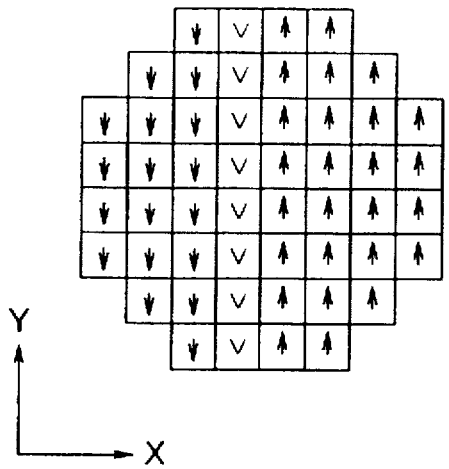
FIG. 23 shows a simulation result of an alignment error (SX.BY) when the movable mirror is distorted.
Figure 24:
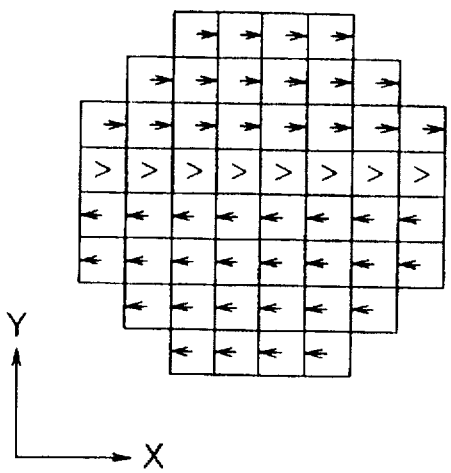
FIG. 24 shows a simulation result of an alignment error (BX.SY) when the movable mirror is distorted.

Further, FIGS. 23 and 24 show results obtained when the movable mirrors 116X, 116Y as shown in FIG. 14 are curved so that the mirror 116X becomes a trapezoid having a height of 100 nm in the X direction and the mirror 116Y becomes a trapezoid having a height of 50 nm in the Y direction, and, in particular, FIG. 23 shows a result obtained when (SX,BY) is used as the alignment error and FIG. 24 shows a result obtained when (BX,SY) is used as the alignment error.

As apparent from FIGS. 23 and 24, the distortion or curvature of the movable mirrors 116X, 116Y affects the degree of perpendicularity ω, rotation θ and non-linear error, but does not affect the scaling values Rx, Ry. That is to say, by comparing FIGS. 23 and 24 with FIGS. 21 and 22, it is found that the error caused by the yawing of the wafer stage WS can be separated from the error caused by the distortion of the movable mirrors 116X, 116Y on the basis of the presence/absence of the scaling errors Rx, Ry. Thus, first of all, after the error caused by the yawing of the wafer stage WS is removed on the basis of the scaling error (for example, the scaling values Rx, Ry are converted into coordinate values and then such values are removed or subtracted from the alignment errors (SX,BY), (BX,SY)), the deviation amounts BX (back X) of the respective shot areas in the X direction are averaged and the deviation amounts BY in the Y direction are also averaged to determine the error caused by the movable mirrors 116X, 116Y.

Figure 25:
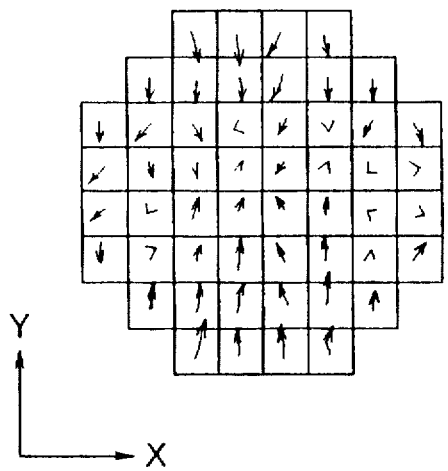
FIG. 25 shows a simulation result of an alignment error (SX.BY) when there are various error factors.
Figure 26:
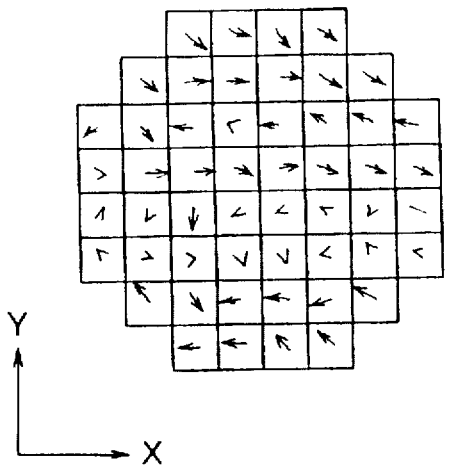
FIG. 26 shows a simulation result of an alignment error (BX.SY) when there are various error factors.
Figure 27:
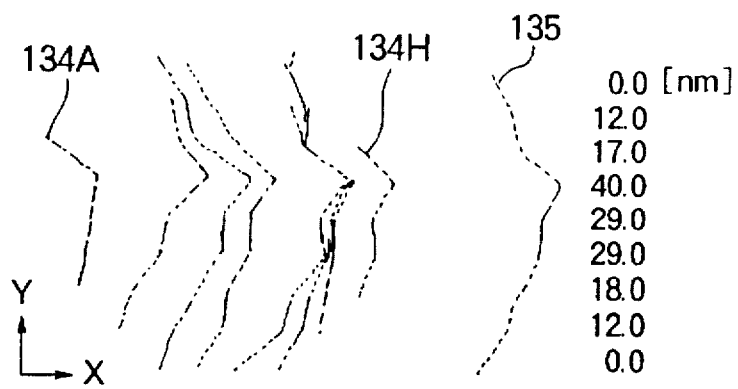
FIG. 27 is a view showing a straightness error in the Y direction due to the distortion of the movable mirror calculated on the basis of the errors shown in FIGS. 25 and 26.
Figure 28:
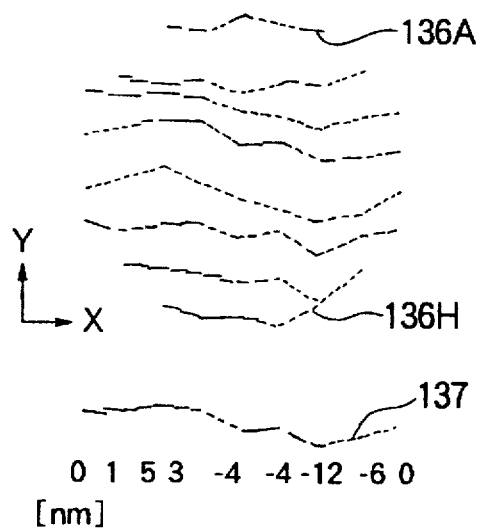
FIG. 28 is a view showing a straightness error in the X direction due to the distortion of the movable mirror calculated on the basis of the errors shown in FIGS. 25 and 26.
Figure 29:
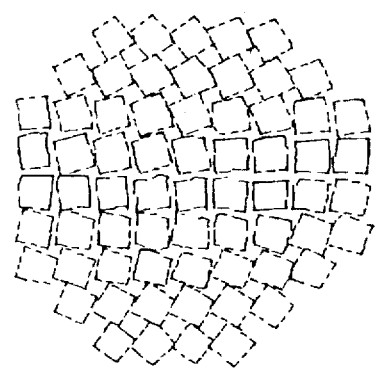
FIG. 29 is a view showing a shot arrangement error due to the yawing calculated on the basis of the errors shown in FIGS. 25 and 26.

Simulation results obtained in this way are shown in FIGS. 25 to 33. FIGS. 25 and 26 show the simulation results obtained when the error caused by the rotation (yawing and the like) of the wafer stage WS is combined with the error caused by the distortion of the movable mirrors 116X, 116Y, and in particular, FIG. 25 shows a result obtained when (SX,BY) is used as the alignment error and FIG. 26 shows a result obtained when (BX,SY) is used as the alignment error. From these errors, in the light of FIGS. 21 and 22, the error caused by the yawing of the wafer stage WS is firstly extracted in consideration of the scaling values Rx, Ry. More specifically, the scaling error Ry (−0.42 ppm) in FIG. 25(b) and −0.42 |rad| in the degree of perpendicularity ω (−0.22 |rad|) in FIG. 26(b) constitute the error caused by the yawing. Further, the scaling error Rx in FIG. 26(b) is substantially zero so that the rotation in the X direction is negligible. Consequently, as shown in FIG. 29, it is found that the error caused by the yawing mainly depends upon the rotation in the Y direction.

After the error caused by the yawing is removed from he results shown in FIGS. 25 and 26, as shown in FIGS. 27 and 28, the error caused by the distortion of the movable mirrors 116X, 116Y is obtained. The broken lines 134A–134H in FIG. 27 show the change in the deviation amounts BX (back X) in respective files of the shot areas, and the broken line 135 shows an average value of the deviation amounts BX shown by the broken lines 134A–134H, i.e., deviation of the shifting trace of the wafer stage WS caused by the distortion of the movable mirror 116X. The numerical values shown on the right side of the broken line 135 indicate the deviation amounts (on the line 135) when it is assumed that the deviation amounts at start and end points are zero, respectively. Similarly, the broken lines 136A–136H in FIG. 28 show the change in the deviation amounts BY (back Y) in rows of the shot areas, and the broken line 137 shows an average value of the deviation amounts BY shown by the broken lines 136A–136H, i.e., deviation of the shifting trace of the wafer stage WS caused by the distortion of the movable mirror 116Y. The numerical values shown below the broken line 137 indicate the deviation amounts (on the line 137) when it is assumed that the deviation amounts at start and end points are zero.

Figure 30:
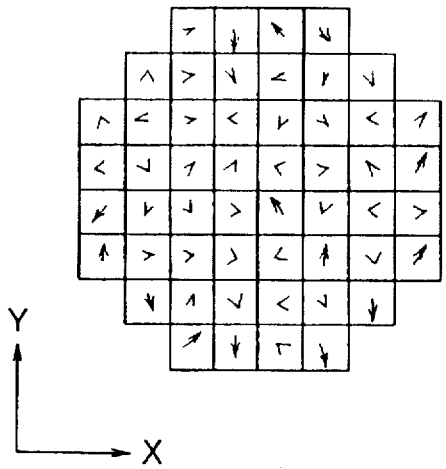
FIG. 30 shows a simulation result of an alignment error (SX.BY) after the errors caused due to the yawing and the distortion of the movable mirror are eliminated from the errors shown in FIGS. 25 and 26.
Figure 31:
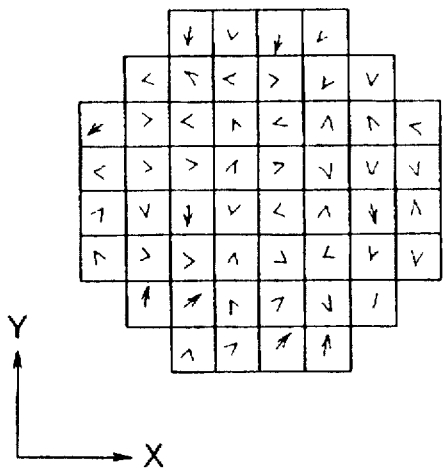
FIG. 31 shows a simulation result of an alignment error (BX.SY) after the errors caused due to the yawing and the distortion of the movable mirror are eliminated from the errors shown in FIGS. 25 and 26.

The deviation amounts (SX,BY), (BX,SY) shown in FIGS. 30 and 31, respectively, are obtained by removing the error caused by the yawing (FIG. 29) and the errors caused by the distortion of the movable mirrors (FIGS. 27 and 28) from the errors shown in FIGS. 25 and 26. The errors shown in FIGS. 30 and 31 are the stepping error in a narrow sense. By indicating or displaying the factors for causing various errors independently in this way, it is possible to properly know which factor mostly influences the error. Accordingly, in order to improve the stepping accuracy, the factor(s) which greatly contributes to the error must be eliminated firstly.

Further, the error caused by various rotations (including the yawing) can be corrected by determining random rotation of each shot area as a rate of change of in difference between X components of the deviation amounts ΔA and ΔC and in difference between Y components of the deviation amounts ΔD and ΔF (FIG. 16B). When the X components of the deviation amounts ΔA and ΔC are $SX_A$, $SX_C$, respectively, the difference between the X components of the deviation amounts ΔA and ΔC becomes $(SX_A-SX_C)$, and, when the Y components of the deviation amounts ΔD and ΔF are $SY_D$, $SY_F$, the difference between the Y components of the deviation amounts ΔD and ΔF becomes $(SY_D-SY_F)$.

Next, another method for analyzing the error in this embodiment will be explained with reference to FIGS. 32A–32C. In this method, the wafers to be measured are successively rested on the wafer stage WS of FIG. 13 and then the evaluation reticle pattern is exposed to the wafers, successively, as shown in FIGS. 16A and 16B. After the exposure, the wafers are developed and then the developed wafers are rested on the wafer stage WS of FIG. 13 again.

Then, as shown in FIG. 16B, regarding each of the shot areas, the alignment errors (SX,BY), (BX,SY) are measured by the LSA system.

The folded lines 131, 130 in FIG. 32A indicate three-time values (3σ) |nm| of the standard deviations of the alignment errors (SX,BY) of the respective wafers measured in this way, and the folded lines 132, 133 in FIG. 32B indicate three-time values (3σ) |nm| of the standard deviations of the alignment errors (BX,SY) of the respective wafers measured in this way.

Further, in this embodiment, the measured results regarding all of the wafers are processed or treated so that, as shown in FIG. 32C, regarding each of the alignment errors (SX,BY), (BX,SY), the following items as obtained:

(1) an average value $AV_W$ |nm| which is obtained by averaging each wafer's 3σ values for all of the wafers;

(2) a dispersion $VR_W$ |nm| represented by the three-time value (3σ) of the standard deviation for all of the shot areas of all of the wafers; and (3) a dispersion $VR_S$ |nm| represented by the three-time value (3σ) of the standard deviation for averaged values, each averaged value being obtained by averaging the errors in the corresponding shot areas of all of the wafers.

Incidentally, reproducibility of each shot area regarding all of the wafers is 10 |nm|. In this case, the average value $AV_W$ indicates average positioning ability of the projection exposure apparatus, the dispersion $VR_S$ indicates an inherent error component of the projection exposure apparatus, and the dispersion $VR_W$ indicates an error including offset fluctuation between the wafers. By analyzing these results, it is possible to determine which error is worst.

In FIGS. 32A–32C, while the three-time values (3σ) of the standard deviations of the alignment errors (SX,BY) and the like were used, by switching modes, for example, the non-linear error component may be analyzed in a similar way to FIG. 32C and the linear error component may also be analyzed in a similar way to FIG. 32C. In this case, the factors for causing the error can be analyzed in more detail. Further, the dispersion between the three-time values (3σ) of the standard deviations is determined by 3σ values to some extent. However, if the 3σ values do not indicate Gauss distribution, by calculating the dispersion between the three-time values 3σ and outputting a result, the factors for causing the error can be analyzed more easily. Similarly, the yawing of the wafer stage WS, the distortion of the movable mirrors 116X, 116Y and other error factors may be grouped or sorted and each error factor may be analyzed as shown in FIG. 32C.

Figure 33A:
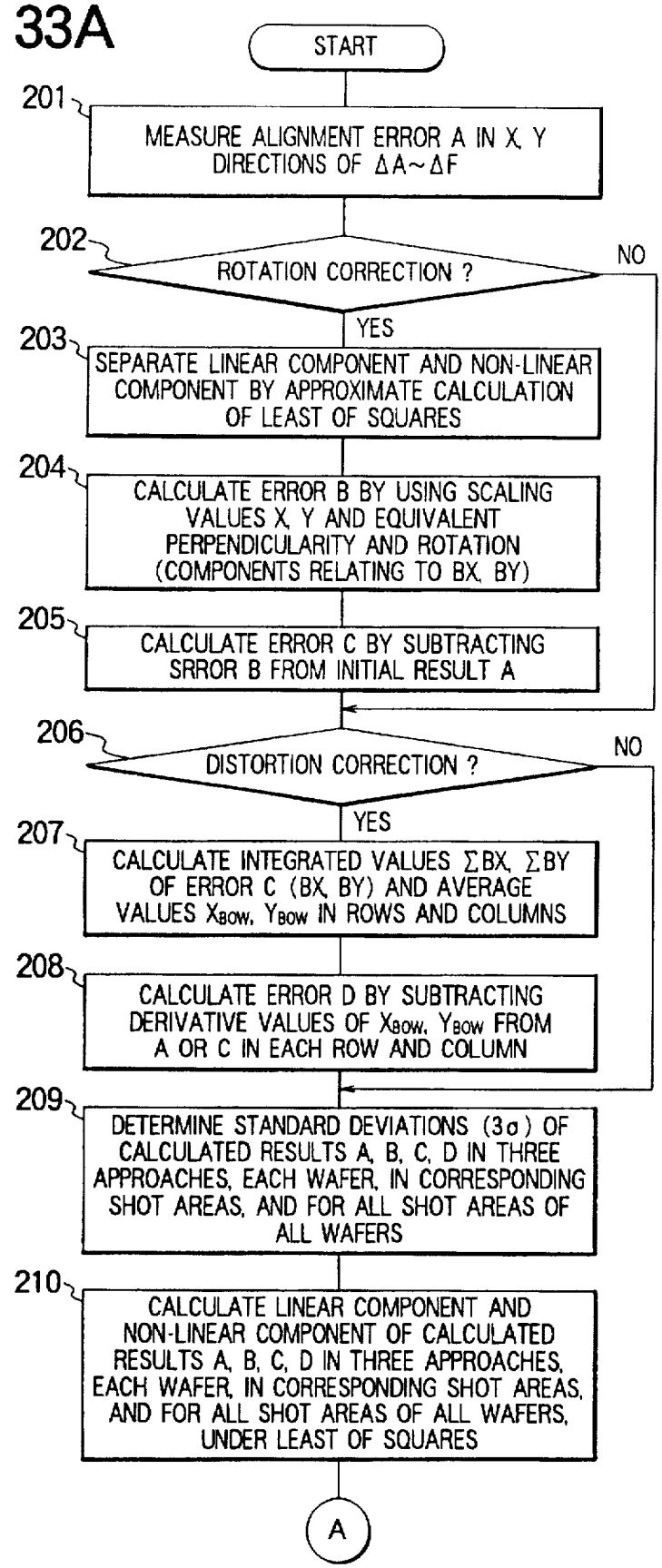
FIGS. 33A and 33B form in combination a flow chart showing a control sequence for carrying out the error analyzing method according to the third embodiment.
Figure 33B:
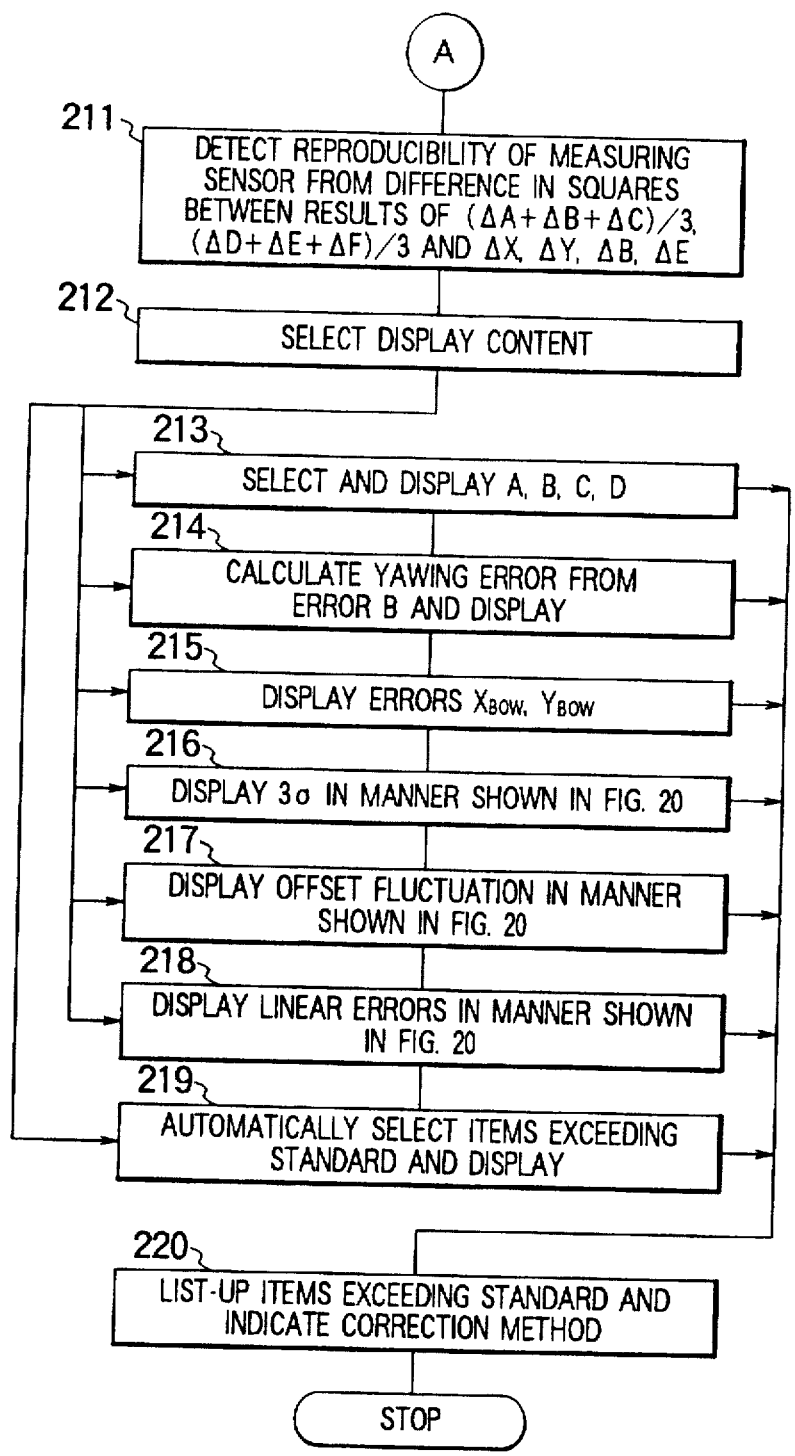

Next, an example of a sequence for carrying out the above-mentioned alignment error analyzing methods together will be explained with reference to FIGS. 33A and 33B. First of all, in a step 201 shown in FIGS. 33A and 33B, the X and Y components of the alignment errors ΔA–ΔF shown in FIG. 16B are measured. Such a measured result is referred to as A. Then, in a step 202, if the rotation such as the yawing of the wafer stage WS is corrected, the sequence goes to a step 203; whereas, if the rotation is not corrected, the sequence goes to a step 206. In the step 203, as shown in FIGS. 25 and 26, the deviation amounts (SX,BY), (BX, SY) in the alignment error A is divided into the linear component and the non-linear component by approximate calculation under the least of squares. Thereafter, in a step 204, on the basis of the linear component, an error B comprised of the scaling values Rx, Ry and the equivalent perpendicularity degree ω and rotation θ is calculated, and, in a step 205, the error B is subtracted from the initial error A to obtain an error C.

Thereafter, in the step 206, if the distortion of the movable mirrors 116X, 116Y is corrected, the sequence goes to a step 207; whereas, if the distortion is not corrected, the sequence goes to a step 209. In the step 207, as shown in FIGS. 27 and 28, integrated values $\Sigma BX$, $\Sigma BY$ of the deviation component (BX,BY) of the error C in column and row directions are calculated, and an average value $X_{BOW}$ (corresponding to the folded line 135 in FIG. 27) and an average value $Y_{BOW}$ (corresponding to the folded line 137 in FIG. 28) regarding the column and low are calculated. Thereafter, in a step 208, an error D is calculated by subtracting derivative values (differential values) of the average values $X_{BOW}$, $Y_{BOW}$ for each column and low from the error A or C.

Then, in the step 209, on the basis of the errors A, B, C, D calculated in this way, as shown in FIG. 32C, the average value $AV_W$ of $3\sigma$ per wafer, the dispersion $VR_W$ represented by the three-time values ($3\sigma$) of the standard deviations of all of the shot areas of all of the wafers, and the dispersion $VR_S$ [nm] represented by the three-time values ($3\sigma$) of the standard deviations in the average values each of which is obtained by averaging the errors in the corresponding shot areas for all of the wafers are determined. Thereafter, in a step 210, regarding the errors A, B, C, D, the linear components and the non-linear components are calculated by approximate calculation under the least of squares with respect to each of the three approaches, namely, (1) a per wafer approach, (2) all shot area approach, (3) and averages in corresponding shot areas. Then, in a step 211, a sum of squares "a" of X component (($\Delta A + \Delta B + \Delta C$)/3) and Y component (($\Delta D + \Delta E + \Delta F$)/3) is determined by using the alignment errors $\Delta A$–$\Delta F$. And, the reproducibility of the measuring sensors, i.e., LSA system alignment system 120 and the like is determined by subtracting a square sum of squares "b" of SX of the error $\Delta B$ and SY of the error $\Delta E$ from the sum of squares "a".

Then, in a step 212, the display content is selected. Thereafter, the sequence goes to either one of steps 213 to 219. In the step 213, the errors A, B, C, D are displayed. In a step 214, the error due to the yawing and the like represented by the error B is displayed. In a step 215, the average values $X_{BOW}$, $Y_{BOW}$ are displayed. In a step 216, the three-time values ($3\sigma$) of the errors $\Delta A$–$\Delta F$ are displayed in a manner shown in FIG. 32C. In a step 217, the offset fluctuation of the stepping value in the linear error component is displayed in a manner shown in FIG. 32C. In a step 218, errors other than the offset in the linear error component are displayed in a manner shown in FIG. 32C. In the step 219, factors or items (in the errors) exceeding the predetermined standard are automatically selected and displayed. Thereafter, in a step 220, the factors exceeding the standard are gathered and the method for correcting the error is designated.

Incidentally, in the above-embodiment, as shown in FIG. 16B, while the six alignment errors $\Delta A$–$\Delta F$ were determined, at least, BY of the error $\Delta B$ and BX of the error $\Delta E$ alone may be measured. When the alignment errors BY, BX are determined, the information regarding the yawing and the distortion of the movable mirrors can be obtained. Further, in this case, the measuring time can be reduced.

Further, in the above-mentioned embodiments, while the LSA alignment system was used as the alignment system, an alignment system of image processing type or an alignment system of so-called two-light-flux interference type may be used. In addition, not only the alignment system of TTL (through the lens) type, but also an alignment system of TTR (through the reticle) type or off-axis type may be applied to the present invention.

According to the first stage accuracy evaluating method in accordance with the third embodiment of the present invention, since the predetermined linear error component is determined on the basis of the deviation amount measured by the vernier evaluation method and the rotational component of the stage during the rotation thereof is determined on the basis of the linear error component, the error component due to the yawing of the stage can be evaluated. Accordingly, if the error component is great, the yawing of the stage will be corrected, thereby improving the stepping accuracy easily and swiftly.

Further, when the deviation amount (in the first and second directions) of the evaluation mark exposed onto the overlapped zone between the adjacent shot areas on the substrate is measured and an error of a straightness of the stage movement (as the stage is shifted in the first or second direction) is determined by subtracting the rotational component of the stage from the measured deviation amount, the error component due to the distortion of the movable mirrors can be determined.

Further, when the deviation amount (in the first and second directions) of the evaluation mark exposed onto the overlapped zone between the adjacent shot areas on the substrate is measured and a positioning error of the stage by subtracting the rotational component of the stage and an error of a straightness of the stage movement (as the stage is shifted in the first or second direction) from the measured deviation amount, the stepping error in a narrow sense can be determined.

On the other hand, according to the second stage accuracy evaluating method in accordance with the third embodiment of the present invention, since the average dispersion of all of the substrates and the dispersion in the same (corresponding) shot areas are determined on the basis of the deviation amounts of the plurality of substrates measured by the vernier evaluation method, the average positioning ability of the projection exposure apparatus and the dispersion in the positioning accuracy regarding the same (corresponding) shot areas can be evaluated. Therefore, for example, if the dispersion regarding the given corresponding shot area is great, by adjusting the stage accordingly, the stepping accuracy can be improved easily and swiftly.

Further, when a difference between (a) an average dispersion obtained by determining a dispersion for each substrate and then averaging them for all of the substrates and (b) the entire dispersion is determined and the positioning error is determined on the basis of this difference, the tendency of the positioning error can be evaluated correctly.

While the invention has been particularly shown and described in reference to preferred embodiments thereof, it will be understood by those skilled in the art that changes in form and details may be made therein without departing from the spirit and scope of the invention.

What is claimed is:

1. A method for evaluating accuracy of a stage in an apparatus having the stage for positioning a photosensitive substrate in first and second directions perpendicular to each other in a two-dimensional plane and adapted to project a pattern of a mask onto said substrate for exposure, comprising the steps of:

a first step for resting a photosensitive evaluation substrate on said stage, projecting said plurality of evaluation marks by using a mask having such evaluation marks onto a first shot area on said evaluation substrate for exposure to form corresponding evaluation marks on the substrate, driving said stage to shift said evaluation substrate, projecting said evaluation marks by using the same mask onto a second shot area on the evaluation substrate for exposure to form corresponding evaluation marks on the substrate, said second shot area being partially overlapped with said first shot area so that at least one of the marks on said first shot area and at least one of the marks on said second shot area are included in an overlapped zone, and repeating the above-mentioned operations;

a second step for measuring deviation amounts of the exposed evaluation marks in said first and second directions for each of the overlapped zones between two adjacent shot areas on said evaluation substrate;

a third step for determining linear error component and a non-linear error component on the basis of the deviation amounts obtained in said second step; and a fourth step for determining a rotational component of said stage when the latter is shifted on the basis of a scaling error component of the stage included in said linear error component determined in said third step.

2. A stage accuracy evaluation method according to claim 1, wherein an error regarding the degree of straightness of the stage movement when the latter is shifted in said first or second direction is determined by subtracting the rotational component of said stage determined in said fourth step from the deviation amounts measured in said second step.

3. A stage accuracy evaluation method according to claim 2, wherein a positioning error for said stage is determined by subtracting the rotational component of said stage determined in said fourth step and the error regarding the degree of straightness of the stage movement when the latter is shifted in said first or second direction, from the deviation amounts measured in said second step.

4. A method for evaluating accuracy of a stage in an apparatus having the stage for positioning a photosensitive substrate in first and second directions perpendicular to each other in a two-dimensional plane and adapted to project a pattern of a mask onto said substrate for exposure, comprising the steps of:

a first step for successively resting a plurality N of photosensitive evaluation substrates on said stage one by one, and for each of the substrates, projecting said plurality of evaluation marks by using a mask having such evaluation marks onto a first shot area on the substrate for exposure to form corresponding evaluation marks on the substrate, driving said stage to shift said evaluation substrate, projecting said evaluation marks by using the same mask onto a second shot area on the evaluation substrate for exposure to form corresponding evaluation marks on the substrate, said second shot area being partially overlapped with said first shot area so that at least one of the marks on said first shot area and at least one of the marks on said second shot area are included in an overlapped zone, and repeating the above-mentioned operations;

a second step for measuring, in each of the said substrates, deviation amounts of the exposed evaluation marks in said first and second directions for each of the overlapped zones between two adjacent shot areas; and a third step for determining: (a) average dispersion value obtained by determining a dispersion value of the deviation amounts for each substrate and averaging the dispersion values for the N evaluation substrates, (b) entire dispersion of the deviation amounts of the N evaluation substrates, and (c) dispersion among the N values each of which represents the deviation amounts in corresponding shot areas of the evaluation substrates, on the basis of the deviation amounts measured in said second step.

5. A stage accuracy evaluation method according to claim 4, wherein a difference between the (a) average dispersion value determined in said third step and the (b) entire dispersion is determined, and a positioning error is determined on the basis of said difference.

* * * * *